US010510762B2

(12) United States Patent
Chiou et al.

(10) Patent No.: US 10,510,762 B2
(45) Date of Patent: Dec. 17, 2019

(54) SOURCE AND DRAIN FORMATION TECHNIQUE FOR FIN-LIKE FIELD EFFECT TRANSISTOR

(71) Applicant: Taiwan Semiconductor Manufacturing Co., Ltd., Hsinchu (TW)

(72) Inventors: Yao-De Chiou, Taoyuan County (TW); Wei-Yuan Lu, Taipei (TW); Chien-I Kuo, Chiayi County (TW); Sai-Hooi Yeong, Hsinchu County (TW); Yen-Ming Chen, Hsin-Chu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/596,963

(22) Filed: May 16, 2017

(65) Prior Publication Data

US 2018/0175046 A1 Jun. 21, 2018

Related U.S. Application Data

(60) Provisional application No. 62/434,608, filed on Dec. 15, 2016.

(51) Int. Cl.
*H01L 27/11* (2006.01)
*H01L 29/66* (2006.01)
(Continued)

(52) U.S. Cl.
CPC ........ *H01L 27/1104* (2013.01); *H01L 29/165* (2013.01); *H01L 29/41791* (2013.01);
(Continued)

(58) Field of Classification Search
CPC ..... H01L 21/823431; H01L 21/823418; H01L 21/823425; H01L 29/66795; H01L 29/785;
(Continued)

(56) References Cited

U.S. PATENT DOCUMENTS 8,836,016 B2   9/2014   Wu et al.
8,841,701 B2   9/2014   Lin et al.
(Continued)

FOREIGN PATENT DOCUMENTS

KR   20160062717 A   6/2016
TW      201137942 A   11/2011
(Continued)

*Primary Examiner* — Nilufa Rahim
(74) *Attorney, Agent, or Firm* — Haynes and Boone, LLP

(57) ABSTRACT

Source and drain formation techniques are disclosed herein for fin-like field effect transistors (FinFETs). An exemplary method for forming epitaxial source/drain features for a FinFET includes epitaxially growing a semiconductor material on a plurality of fins using a silicon-containing precursor and a chlorine-containing precursor. The semiconductor material merges to form an epitaxial feature spanning the plurality of fins, where the plurality of fins has a fin spacing that is less than about 25 nm. A ratio of a flow rate of the silicon-containing precursor to a flow rate of the chlorine-containing precursor is less than about 5. The method further includes etching back the semiconductor material using the chlorine-containing precursor, thereby modifying a profile of the epitaxial feature. The epitaxially growing and the etching back may be performed only once. In some implementations, where the FinFET is an n-type FinFET, the epitaxially growing also uses a phosphorous-containing precursor.

20 Claims, 12 Drawing Sheets

(51) Int. Cl.
  *H01L 29/417* (2006.01)
  *H01L 29/78* (2006.01)
  *H01L 29/165* (2006.01)

(52) U.S. Cl.
  CPC ...... *H01L 29/66795* (2013.01); *H01L 29/785* (2013.01); *H01L 29/7848* (2013.01); *H01L 29/66545* (2013.01); *H01L 2029/7858* (2013.01)

(58) Field of Classification Search
  CPC ....... H01L 29/41791; H01L 2029/7858; H01L 27/0886
  USPC .......................................... 438/283
  See application file for complete search history.

(56) References Cited

U.S. PATENT DOCUMENTS

| | | | |
|---|---|---|---|
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,362,175 B2 | 6/2016 | Tsai et al. | |
| 9,461,168 B1 | 10/2016 | Ok et al. | |
| 9,520,482 B1 | 12/2016 | Chang et al. | |
| 9,576,814 B2 | 2/2017 | Wu et al. | |
| 2014/0175554 A1* | 6/2014 | Loubet | H01L 21/823431 257/368 |
| 2015/0236124 A1* | 8/2015 | Chang | H01L 29/66628 257/288 |
| 2016/0042963 A1 | 2/2016 | Kim et al. | |
| 2016/0079367 A1* | 3/2016 | Yoo | H01L 29/785 257/77 |
| 2016/0149036 A1* | 5/2016 | Huang | H01L 29/7848 257/401 |

FOREIGN PATENT DOCUMENTS

| | | |
|---|---|---|
| TW | 201212467 A | 3/2012 |
| TW | 201409581 A | 3/2014 |
| TW | 201507156 A | 2/2016 |
| TW | 201635534 A | 10/2016 |

* cited by examiner

SOURCE AND DRAIN FORMATION TECHNIQUE FOR FIN-LIKE FIELD EFFECT TRANSISTOR

This application is a non-provisional application of and claims benefit of U.S. Provisional Patent Application Ser. No. 62/434,608, filed Dec. 15, 2016, the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as fin-like field effect transistor (FinFET) technologies progress towards smaller feature sizes (such as 32 nanometers, 28 nanometers, 20 nanometers, and below), advanced techniques are needed for precisely controlling profiles and/or dimensions of source/drain features to ensure and/or optimize FinFET device reliability. Although existing FinFET source and drain formation techniques have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
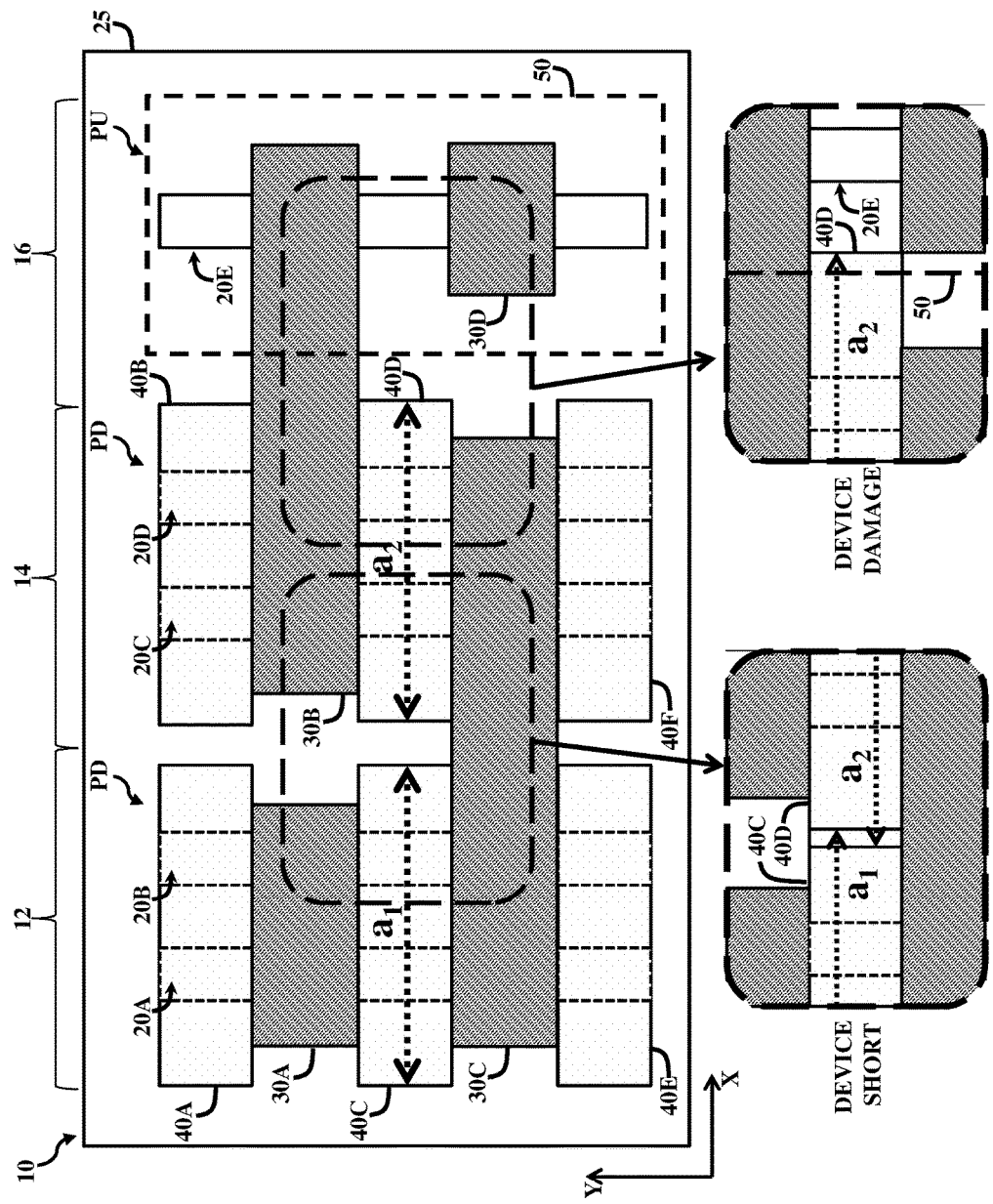
FIG. 1 is a simplified schematic top view of a fin-like field effect transistor (FinFET) based static random access memory (SRAM) device, in portion or entirety, according to various aspects of the present disclosure.

The present disclosure relates generally to integrated circuit devices, and more particularly, to fin-like field effect transistors (FinFETs).

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a simplified schematic top view of a static random access memory (SRAM) device 10, in portion or entirety, according to various aspects of the present disclosure. In FIG. 1, SRAM device 10 is viewed in an X-Y plane at an intermediate stage of fabrication. SRAM device 10 may be included in a microprocessor, a memory, and/or other integrated circuit device. In some implementations, SRAM device 10 may be a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. FIG. 1 has been simplified for the sake of clarity to better understand the inventive concepts of the present disclosure. Additional features can be added in SRAM device 10, and some of the features described below can be replaced, modified, or eliminated in other embodiments of SRAM device 10.

SRAM device 10 includes various regions, such as a first region 12, a second region 14, and a third region 16 configured according to design requirements of SRAM device 10. In the depicted embodiment, first region 12 is configured as an n-type device region, second region 14 is configured as an n-type device region, and third region 16 is configured as a p-type device region. For example, first region 12 includes a pull-down FinFET (PD), second region 14 includes a pull-down FinFET (PD), and third region 16 includes a pull-up FinFET (PU). In furtherance of the depicted embodiment, pull-down FinFETs in first region 12 and second region 14 are configured as n-type FinFETs, while pull-up FinFET in third region 16 is configured as a p-type FinFET. In some implementations, one or more pass-gate FinFETs (not shown) and/or other functional FinFETs may be included in first region 12, second region 14, third region 16, and/or other region according to design requirements of SRAM device 10.

SRAM device 10 includes various fins 20A, 20B, 20C, 20D, and 20E (also referred to as active fin regions) disposed over a substrate 25. Fins 20A-20E are oriented substantially parallel to one another, each having a width defined in an x-direction, a length defined in a y-direction, and a height defined in a z-direction (not shown). In FIG. 1, the pull-down transistor in first region 12 includes fin 20A and fin 20B, the pull-down transistor in second region 14 includes fin 20C and fin 20D, and the pull-up transistor in third region 16 includes fin 20E (in other words, the pull-down transistors are multi-fin FinFETs, while the pull-up transistor is a single fin FinFET). Fins 20A-20E each have a channel region, a source region, and a drain region defined along their length in the y-direction, where the channel region is disposed between the source region and the drain region (generally referred to as source/drain regions). In some implementations, fins 20A-20E are a portion of substrate 25 (such as a portion of a material layer of substrate 25). Alternatively, in some implementations, fins 20A-20E are defined in a material layer, such as one or more semiconductor material layers, overlying substrate 25. In some implementations, fins 20A-20E are disposed over doped regions of substrate 25 according to configuration of first region 12, second region 14, and/or third region 16. For example, fins 20A-20D may be disposed over p-type doped regions (wells) disposed in substrate 25 in first region 12 and second region 14, while fin 20E may be disposed over an n-type doped region (well) disposed in substrate 25 in third region 16.

Gate structures 30A, 30B, 30C, and 30D are disposed over the channel regions of fins 20A-20E. In some implementations, gate structures 30A-30D wrap the channel regions of fins 20A-20E, thereby interposing the source/drain regions of fins 20A-20E. In the depicted embodiment, gate structures 30A-30D extend along the x-direction (for example, substantially perpendicular to fins 20A-20E). Gate structures 30A-30D engage the channel regions of fins 20A-20E, such that current can flow between the source/drain regions of fins 20A-20E during operation. Gate structures 30A-30D include gate stacks, which are configured according to whether SRAM device 10 is fabricated according to a gate last process or a gate first process. In the depicted embodiment, SRAM device 10 is fabricated according to a gate last process, where the depicted gate structures 30A-30D include dummy gate stacks that are subsequently replaced with metal gate stacks. The dummy gate stacks include, for example, an interfacial layer and a dummy gate electrode layer. The interfacial layer is disposed between the dummy gate electrode layer and fins 20A-20E, where the interfacial layer and the dummy gate electrode layer are configured to wrap the channel regions of fins 20A-20E. In some implementations, the interfacial layer includes a dielectric material, such as silicon oxide, and the dummy gate electrode layer includes polysilicon or other suitable dummy gate material. In some implementations, the dummy gate stack further includes a dummy gate dielectric layer disposed between the interfacial layer and the dummy gate electrode layer. The dummy gate dielectric layer can include a dielectric material (for example, silicon oxide), high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$-$Al_2O_3$) alloy, other suitable high-k dielectric materials, or combinations thereof. In some implementations, the interfacial layer is omitted from the dummy gate stack, such that the dummy gate dielectric layer is disposed between fins 20A-20E and the dummy gate electrode layer. The dummy gate stacks can include numerous other layers, for example, an interfacial layer, a capping layer, a diffusion layer, a barrier layer, a hard mask layer, other suitable layer, or combinations thereof. In some implementations, gate structures 30A-30D include spacers disposed adjacent to the dummy gate stacks. The spacers include a dielectric material, such as silicon oxide, silicon nitride, silicon oxynitride, silicon carbide, other suitable dielectric material, or combinations thereof. In some implementations, the spacers include more than one set of spacers (for example, seal spacers, offset spacers, and dummy spacers). In some implementations, the spacers have a multi-layer structure, such as a silicon nitride layer and a silicon oxide layer. The spacers are formed by any suitable process. For example, a silicon oxide layer can be deposited over fins 20A-20D and subsequently anisotropically etched (for example, dry etched) to form a first set of spacers (such as seal spacers) adjacent to the dummy gate stacks, and a silicon nitride layer can be deposited over fins 20A-20D and subsequently etched (for example, dry etched) to form a second set of spacers (such as offset spacers or dummy spacers) adjacent to the first set of spacers.

Though not depicted, a gate replacement process is eventually performed to replace the dummy gate stacks of gate structures 30A-30D with metal gate stacks. In gate first process implementations, gate structures 30A-30D as depicted include the metal gate stacks. The metal gate stacks include, for example, a gate dielectric layer (which can include materials similar to the interfacial layer and/or the dummy gate dielectric layer) and a gate electrode layer disposed over the gate dielectric layer. The gate electrode layer includes a conductive material, such as polysilicon, Al, Cu, Ti, Ta, W, Mo, TaN, NiSi, CoSi, TiN, WN, TiAl, TiAlN, TaCN, TaC, TaSiN, other conductive material, or combinations thereof. In some implementations, the gate electrode layer includes a work function layer, which is a conductive layer tuned to have a desired work function (such as an n-type work function or a p-type work function), and a conductive layer formed over the work function layer (sometimes referred to as a metal fill layer). In various examples, the work function layer includes Ta, TaN, NiSi, CoSi, TiN, WN, TiAl, TiAlN, TaCN, TaC, TaSiN, other material suitable for achieving a desired work function, or combinations thereof. The conductive layer formed over the work function layer includes a suitable conductive material, such as Al, W, Cu, or combinations thereof. The conductive layer may additionally or alternatively include polysilicon, Ti, Ta, metal alloys, other suitable materials, or combinations thereof. The metal gate stacks can include numerous other layers, for example, an interfacial layer, a capping layer, a diffusion layer, a barrier layer, a hard mask layer, other suitable layer, or combinations thereof.

Epitaxial features 40A, 40B, 40C, 40D, 40E, and 40F are disposed over the source/drain regions of fins 20A-20D. In the depicted embodiment, epitaxial features 40A-40F are formed over the source/drain regions of fins 20A-20D after a fin recess process (for example, an etch back process), such that epitaxial features 40A-40F are grown from recessed fins 20A-20D. In some implementations, epitaxial features 40A-40F wrap the source/drain regions of fins 20A-20D. In such implementations, fins 20A-20D may not be subjected to a fin recess process. Epitaxial features 40A-40F are configured for n-type devices, such as the pull-down transistors in first region 12 and second region 14, such that epitaxial features 40A-40F may alternatively be referred to as n-type epitaxial source/drain features. For example, epitaxial features 40A-40F include silicon or silicon carbon, where the silicon or silicon carbon is doped with phosphorous, arsenic, other n-type dopant, or combinations thereof. In some implementations, epitaxial features 40A-40F are Si:P epitaxial features. In some implementations, epitaxial features 40A-40F are Si:C:P epitaxial features. Epitaxial features 40A-40F extend (grow) laterally along the x-direction (in some implementations, substantially perpendicular to fins 20A-20D), where each epitaxial feature 40A-40F has a corresponding lateral dimension a, such as a width of epitaxial features 40A-40F. For example, $a_1$ represents a lateral dimension of epitaxial feature 40C, and $a_2$ represents a lateral dimension of epitaxial feature 40D.

Typically, n-type epitaxial source/drain features for n-type source/drain regions (such as epitaxial features 40A-40F) are formed using a cyclic deposition etch (CDE) process, which is a sequence of deposition processes and etch processes configured to alternately deposit and etch a semiconductor material. Each cycle of the CDE process includes a deposition process and an etching process, where the CDE process implements multiple cycles to form epitaxial source/drain features. In some implementations, the deposition process is a chemical vapor deposition (CVD) process configured to epitaxially grow a semiconductor material, such as silicon, from source/drain regions of fins. Dopants can be added to the semiconductor material during the CVD process. As a thickness of the semiconductor material increases during the CVD process, the semiconductor material often exhibits crystalline defects (also referred to as lattice defects) and/or crystalline impurities. For example, the semiconductor material may include amorphous (non-crystalline) portions that can negatively impact device performance. In some implementations, the etching process is a selective etching process that can selectively remove the crystalline defects and/or crystalline impurities, such as the amorphous portions of the semiconductor material. By tuning various parameters of each CDE cycle (such as the CVD process and the selective etch process), the CDE process has proven generally successful in obtaining n-type epitaxial source/drain features having minimal defects, while achieving desired strain characteristics in the channel region.

As FinFET technologies progress towards smaller feature sizes (such as 16 nanometers, 10 nanometers, 7 nanometers, and below), controlling lateral growth (and thus lateral dimension a) of source/drain epitaxial features, such as $a_1$ and $a_2$ of epitaxial source/drain features 40A-40F, is critical to ensuring operational integrity of SRAM device 10. It has been observed that traditional CDE processes lack precise profile control in advanced FinFET technology nodes, particularly those targeting fin spacing less than or equal to about 25 nm. In particular, traditional CDE processes are unable to adequately control lateral epitaxial growth of the semiconductor material, producing large variations in lateral dimension a of epitaxial source/drain features, which can unintentionally merge epitaxial source/drain features of different devices and/or unintentionally extend epitaxial source/drain features into areas of a device (such as SRAM device 10) that can damage the epitaxial source/drain features during fabrication. For example, in FIG. 1, when $a_1$ of epitaxial feature 40C and $a_2$ of epitaxial feature 40D are not well controlled, epitaxial feature 40C may merge with epitaxial feature 40D, causing an electrical short between the pull-down transistor of first region 12 and the pull-down transistor of second region 14. In another example, in FIG. 1, when $a_2$ of epitaxial feature 40D is not well controlled, epitaxial feature 40D may extend into an etch process window 50 used for recessing fin 20E in third region 16, such that epitaxial feature 40D is exposed to an etching process used for recessing fin 20E, thereby damaging epitaxial feature 40D. In some implementations, epitaxial feature 40D may extend into a process window used for exposing fin 20E to an epitaxial source/drain formation process in third region 16, such that epitaxial feature 40D is exposed to semiconductor materials (such as those used for a p-type device) that can change and/or degrade operation of the pull-down transistor in second region 14. Advanced epitaxial source/drain formation techniques are thus needed to ensure precise profile control of epitaxial source/drain features with minimal lateral variation.

Figure 2:
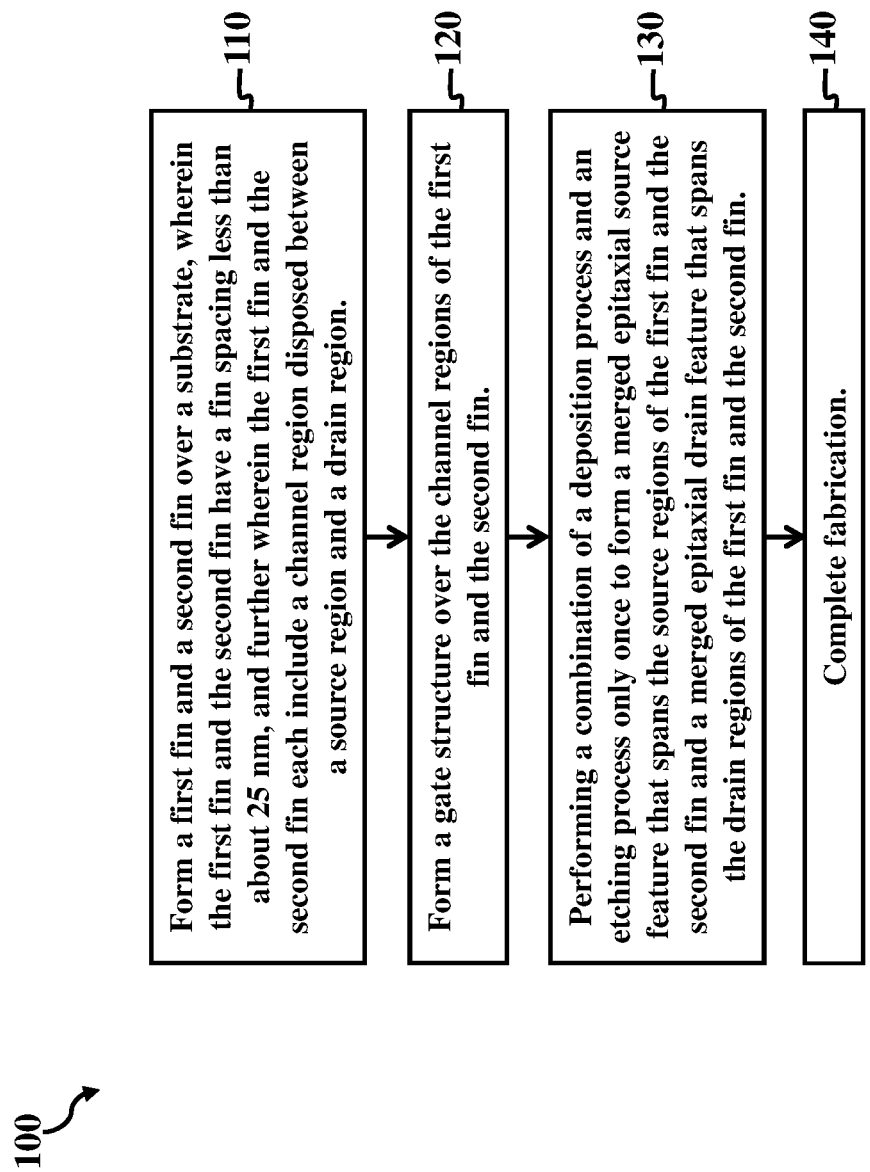
FIG. 2 is a flow chart of a method for fabricating an integrated circuit device that includes FinFET devices according to various aspects of the present disclosure.

FIG. 2 is a flow chart of a method 100 for fabricating an integrated circuit device according to various aspects of the present disclosure. In the present embodiment, method 100 fabricates an integrated circuit device that includes a FinFET device. At block 110, a first fin and a second fin are formed over a substrate. The first fin and the second fin have a fin spacing less than about 25 nm. The first fin and the second fin each include a channel region disposed between a source region and a drain region. At block 120, a gate structure is formed over the channel regions of the first fin and the second fin. In some implementations, the gate structure includes a dummy gate stack. At block 130, a combination of a deposition process and an etching process is performed only once to form a merged epitaxial source feature that spans the source regions of the first fin and the second fin and a merged epitaxial drain feature that spans the drain regions of the first fin and the second fin. In some implementations, the deposition process includes epitaxially growing a semiconductor material on the first fin and the second fin using a silicon-containing precursor and a chlorine-containing precursor (for example, hydrogen chloride (HCl)). A ratio of a flow rate of the silicon-containing precursor to a flow rate of the chlorine-containing precursor is less than about 5. In some implementations, the etching process uses the chlorine-containing precursor, thereby modifying a profile of the merged epitaxial source feature and the merged epitaxial drain feature. In some implementations, the deposition process also uses a dopant-containing precursor, such as a phosphorous-containing precursor, thereby doping merged epitaxial source feature and merged epitaxial drain feature. At block 140, the method 100 may continue to complete fabrication of the integrated circuit device. For example, in some implementations, a gate replacement process is performed to replace the dummy gate stack with a metal gate stack. Additional steps can be provided before, during, and after method 100, and some of the steps described can be moved, replaced, or eliminated for additional embodiments of method 100.

FIGS. 3A-3J are fragmentary cross-sectional views of an integrated circuit device 200, in portion or entirety, at various fabrication stages (such as those associated with method 100) according to various aspects of the present disclosure. Integrated circuit device 200 may be included in a microprocessor, a memory, and/or other integrated circuit device. In some implementations, integrated circuit device 200 may be a portion of an IC chip, a SoC, or portion thereof, that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof. FIGS. 3A-3J have been simplified for the sake of clarity to better understand the inventive concepts of the present disclosure. Additional features can be added in integrated circuit device 200, and some of the features described below can be replaced, modified, or eliminated in other embodiments of integrated circuit device 200.

Figure 3A:
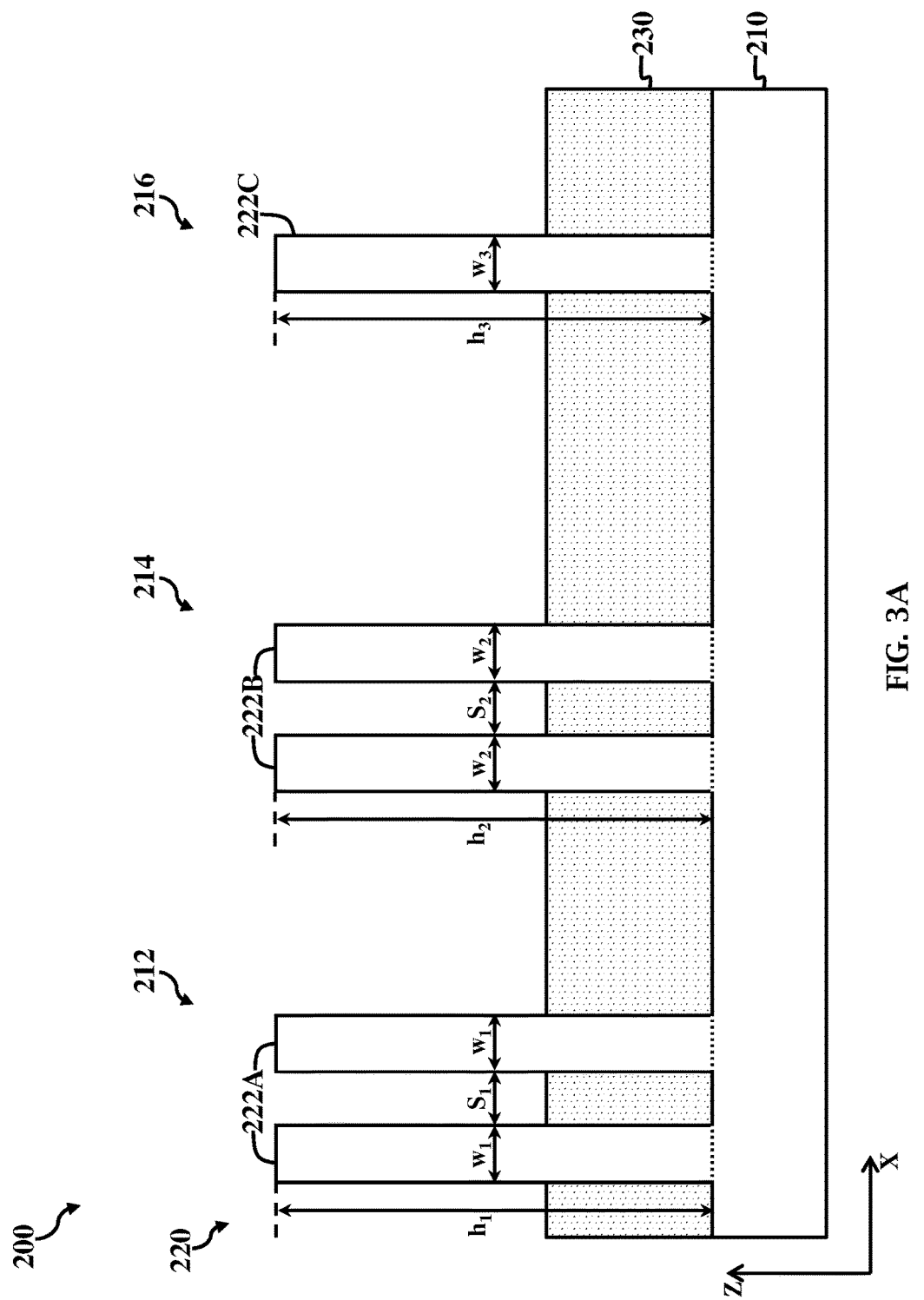
FIGS. 3A-3J are fragmentary cross-sectional views of an integrated circuit that includes FinFET devices, in portion or entirety, at various fabrication stages, such as those associated with the method of FIG. 2, according to various aspects of the present disclosure.

In FIG. 3A, integrated circuit device 200 includes a substrate (wafer) 210. In the depicted embodiment, substrate 210 includes silicon. Alternatively or additionally, substrate 210 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 210 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 210 can include various doped regions (not shown) depending on design requirements of integrated circuit device 200. In some implementations, substrate 210 includes p-type doped regions (for example, p-type wells) doped with p-type dopants, such as boron, indium, other p-type dopant, or combinations thereof. In some implementations, substrate 210 includes n-type doped regions (for example, n-type wells) doped with n-type dopants, such as phosphorus, arsenic, other n-type dopant, or combinations thereof. In some implementations, substrate 210 includes doped regions formed with a combination of p-type dopants and n-type dopants. The various doped regions can be formed directly on and/or in substrate 210, for example, providing a p-well structure, an n-well structure, a dual-well structure, a raised structure, or combinations thereof. An ion implantation process, a diffusion process, and/or other suitable doping process can be performed to form the various doped regions in substrate 210.

Various regions are defined in substrate 210, such as a first region 212, a second region 214, and a third region 216. For purposes of the following discussion, first region 212 is configured as an n-type FinFET region, second region 214 is configured as an n-type FinFET region, and third region 216 is configured as a p-type FinFET region. Doped regions formed on and/or in substrate 210 are configured to accommodate functionality of devices and/or features formed in first region 212, second region 214, and third region 216. In some implementations, first region 212, second region 214, and third region 216 form a portion of a memory region of integrated circuit device 200, such as a SRAM region. For example, in the depicted embodiment, first region 212 includes a pull-down FinFET, second region 214 includes a pull-down FinFET, and third region 216 includes a pull-up FinFET. In such implementations, pull-down FinFETs in first region 212 and second region 214 are configured as n-type FinFETs, while pull-up FinFET in third region 216 is configured as a p-type FinFET. In some implementations, first region 212, second region 214, and third region 216 correspond with first region 12, second region 14, and third region 16 of SRAM device 10 of FIG. 1. In some implementations, one or more pass-gate FinFETs may be included in first region 212, second region 214, third region 216, and/or other region defined in substrate 210. Such configuration of integrated circuit device 200 is provided for simplification and ease of understanding and does not necessarily limit the depicted embodiment to any number of devices, any number of regions, or any configuration of structures and/or regions. For example, integrated circuit device 200 may further include one or more regions configured as a logic region, other memory region, an analog region, an input/output (or peripheral) region, a dummy region, or other region depending on design requirements of integrated circuit device 200.

A fin structure 220 is formed over substrate 210. In FIG. 3A, fin structure 220 includes a plurality of fins extending from substrate 210, though the present disclosure contemplates embodiments where fin structure 220 includes a single fin extending from substrate 210. For example, fin structure 220 includes fins 222A in first region 212, fins 222B in second region 214, and fin 222C in third region 216. As such, fin structure 220 is configured to accommodate a multi-fin FinFET in first region 212, a multi-fin FinFET in second region 214, and a single fin FinFET in third region 216, although the present disclosure contemplates various numbers of fins in first region 212, second region 214, and third region 216 to optimize performance of integrated circuit device 200. In some implementations, fin structure 220 is a portion of substrate 210 (such as a portion of a material layer of substrate 210). For example, in the depicted embodiment, where substrate 210 includes silicon, fin structure 220 includes silicon. Alternatively, in some implementations, fin structure 220 is defined in a material layer, such as a semiconductor material layer, overlying substrate 210. In such implementations, fin structure 220 can include a semiconductor layer stack (for example, a heterostructure) having various semiconductor layers. The semiconductor layers include any suitable material, such as silicon, germanium, silicon germanium, other suitable material, or combinations thereof. The semiconductor layers can include same or different materials, dopants, etching rates, constituent atomic percentages, constituent weight percentages, thicknesses, and/or configurations depending on design requirements of integrated circuit device 200.

Fins 222A, fins 222B, and fin 222C have a width defined in an x-direction, a length defined in a y-direction (not shown), and a height defined in a z-direction. For example, fins 222A have a height $h_1$, a width $w_1$ defined by a pair of sidewalls, and a length $l_1$ defined by a pair of sidewalls (not shown in the depicted view); fins 222B have a height $h_2$, a width $w_2$ defined by a pair of sidewalls, and a length $l_2$ defined by a pair of sidewalls (not shown in the depicted view); and fin 222C has a height $h_3$, a width $w_3$ defined by a pair of sidewalls, and a length $l_3$ defined by a pair of sidewalls (not shown in the depicted view). In some implementations, height h is about 10 nm to about 200 nm, and width $w_1$ is about 5 nm to about 50 nm. For example, in the depicted embodiment, height h is about 20 nm to about 40 nm, and width $w_1$ is about 5 nm to about 10 nm. Adjacent fins 222A are separated by a space $S_1$, where a pitch $P_1$ of fins 222A generally refers to a sum of a width of a particular fin 222A (such as $w_1$) and a width of a space adjacent to the particular fin 222A (such as $S_1$) (in other words, $P_1=w_1+S_1$). Adjacent fins 222B are separated by a space $S_2$, where a pitch $P_2$ of fins 222B generally refers to a sum of a width of a particular fin 222B (such as $w_2$) and a width of a space adjacent to the particular fin 222B (such as $S_2$) (in other words, $P_2=w_2+S_2$). Space $S_1$ and/or space S2 are less than about 25 nm, such that pitch $P_1$ and/or pitch $P_2$ are less than about 75 nm. For example, space $S_1$ and/or space S2 are about 5 nm to about 15 nm, and pitch $P_1$ and/or pitch $P_2$ are about 10 nm to about 75 nm. In some implementations, pitch $P_1$ and/or pitch $P_2$ is a minimum pitch achievable respectively between fins 222A and fins 222B by a lithography process for a given technology node. In implementations where third region 216 includes more than one fin 222C, adjacent fins 222C may be separated by a defined space, such as a space $S_3$, where a pitch $P_3$ of fins 222C generally refers to a sum of a width of a particular fin 222C (such as $w_3$) and a width of a space adjacent to the particular fin 222C (such as $S_3$) (in other words, $P_3=w_3+S_3$). The present disclosure contemplates variations in height, width, and length of fins 222A, fins 222B, and/or fin 222C that may arise from processing and fabrication.

A combination of deposition, lithography, and/or etching processes are performed to define fin structure 220 extending from substrate 210 as illustrated in FIG. 3A. For example, forming fin structure 220 includes performing a lithography process to form a patterned resist layer over substrate 210 (or a material layer disposed over substrate 210) and performing an etching process to transfer a pattern defined in the patterned resist layer to substrate 210 (or the material layer disposed over substrate 210). The lithography process can include forming a resist layer on substrate 210 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes portions of substrate 210, where the etching process uses the patterned resist layer as an etch mask. The etching process can include a dry etching process, a wet etching process, other suitable etching process, or combinations thereof. In some implementations, a reactive ion etching (RIE) process is performed. After the etching process, the patterned resist layer is removed from substrate 210, for example, by a resist stripping process. Alternatively, fin structure 220 is formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some implementations, directed self-assembly (DSA) techniques are implemented while forming fin structure 220. Further, in some alternate implementations, the exposure process can implement maskless lithography, electron-beam (e-beam) writing, ion-beam writing, and/or nanoimprint technology for patterning the resist layer.

An isolation feature(s) 230 is formed over and/or in substrate 210 to isolate various regions, such as various device regions, of integrated circuit device 200. For example, isolation feature 230 separates and isolates first region 212, second region 214, and third region 216 from each other. Isolation feature 230 also separates and isolates fins of fin structure 220 within each region from each other, such as fins 222A and fins 222B. In the depicted embodiment, isolation feature 230 surrounds a portion of fin structure 220, such as a bottom portion. Isolation feature 230 includes silicon oxide, silicon nitride, silicon oxynitride, other suitable isolation material, or combinations thereof. Isolation feature 230 can include different structures, such as shallow trench isolation (STI) structures, deep trench isolation (DTI) structures, and/or local oxidation of silicon (LOCOS) structures. In some implementations, isolation feature 230 includes STI features that define and electrically isolate active and/or passive device regions, such as first region 212, second region 214, and third region 216. For example, STI features can be formed by etching a trench in substrate 210 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation feature 230. In another example, STI features can be formed by depositing an insulator material over substrate 210 after forming fin structure 220 (in some implementations, such that the insulator material layer fills gaps (trenches) between fins 222A, fins 222B, and fins 222C) and etching back the insulator material layer to form isolation feature 230. In some embodiments, STI features include a multi-layer structure that fills the trenches, such as a silicon nitride layer disposed over a thermal oxide liner layer. In another example, STI features include a dielectric layer disposed over a doped liner layer (such as a boron silicate glass (BSG) liner layer or a phosphosilicate glass (PSG) liner layer). In yet another example, STI features include a bulk dielectric layer disposed over a liner dielectric layer, where the bulk dielectric layer and the liner dielectric layer include materials depending on design requirements.

Fins 222A, fins 222B, and fin 222C each have a channel region, a source region, and a drain region defined along their length (here, along the y-direction), where the channel region is disposed between the source region and the drain region (collectively referred to as source/drain regions). Source/drain regions of fins 222A, fins 222B, and fin 222C are depicted in FIGS. 3A-3J. Though not depicted, a gate structure is disposed over portions of fins 222A, fins 222B, and fin 222C. For example, a gate structure wrap the channel regions of fins 222A, fins 222B, and fin 222C, thereby interposing the source/drain regions of fins 222A, fins 222B, and fin 222C. In some implementations, the gate structures engages the sidewall portions of the channel regions and a top portion of the channel regions defined between the sidewall portions, such that the gate structure engages three sides of the channel regions of fins 222A, fins 222B, and fin 222C. In some implementations, the gate structures are similar to gate structures 30A-30D described above with reference to FIG. 1. For example, in the depicted embodiment, integrated circuit device 200 is fabricated according to a gate last process, such that the gate structures include a dummy gate stack as described in detail above. The gate structures are formed by a combination of deposition, lithography, and/or etching processes, other suitable processes, or combinations thereof. For example, a deposition process can be performed to form an interfacial layer over substrate 210, particularly over fin structure 220 (here, fins 222A, fins 222B, and fin 222C) and isolation feature 230, and a deposition process can be performed to form a dummy gate electrode layer over the interfacial layer. In some implementations, a deposition process is performed to form a dummy gate dielectric layer over the interfacial layer before forming the dummy gate electrode layer. The deposition processes include CVD, physical vapor deposition (PVD), atomic layer deposition (ALD), high density plasma CVD (HDP-CVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. A lithography patterning and etching process can then performed to pattern the interfacial layer and the dummy gate dielectric layer (and, in some implementations, the dummy gate dielectric layer) to form the dummy gate stack. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, electron-beam writing, or ion-beam writing. In yet another alternative, the lithography patterning process implements nanoimprint technology. The etching processes include dry etching processes, wet etching processes, other etching processes, or combinations thereof.

Figure 3B:
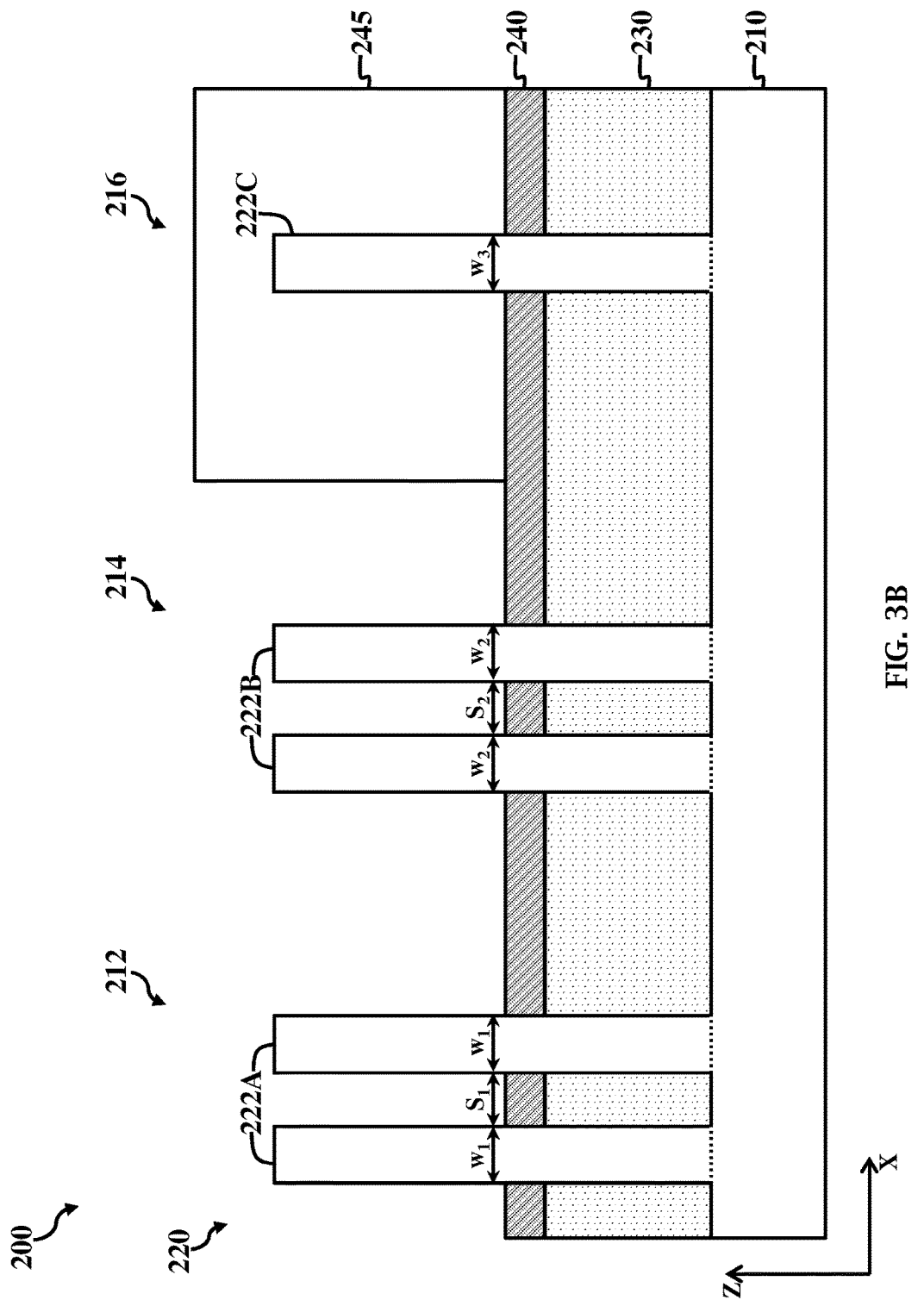
Figure 3C:
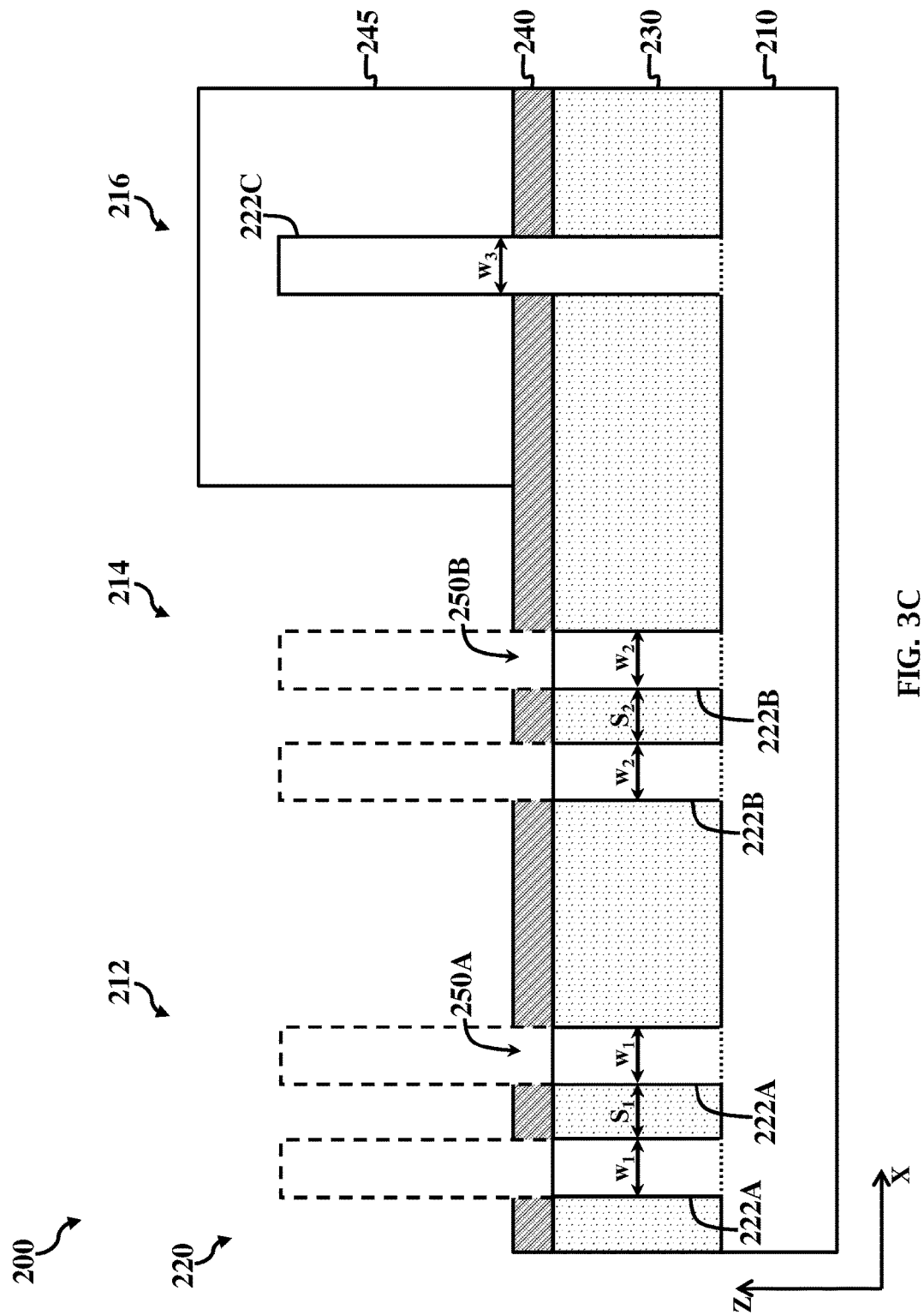

In FIGS. 3B-3F, epitaxial source features and epitaxial drain features (referred to herein as epitaxial source/drain features) are formed in source/drain regions of n-type FinFET regions, such as first region 212 and second region 214. Turning to FIG. 3B and FIG. 3C, processing continues with recessing source/drain regions of fins in n-type device regions of integrated circuit device 200, such as first region 212 and second region 214. In FIG. 3B, a mask layer 240 is formed over substrate 210 (in the depicted embodiment, over isolation feature 230), and a patterned resist layer 245 is formed over mask layer 240. Mask layer 240 includes a material having a different etching rate than a material of fin structure 220 (in particular, fins 222A and fins 222B). For example, mask layer 240 includes silicon nitride, silicon oxide, silicon oxynitride, silicon carbide, silicon carbon nitride, amorphous silicon, polysilicon, other suitable material, or combinations thereof. In the depicted embodiment, mask layer 240 includes silicon nitride. In some implementations, mask layer 240 includes a material that has a low etch rate relative to a material of fin structure 220, such that fins 222A and fins 222B can be selectively etched relative to mask layer 240. Mask layer 240 is formed by any suitable process, such as a CVD process, to any suitable thickness. In some implementations, a silicon-containing and nitrogen-containing mask layer is formed using LPCVD. In some implementations, a silicon-containing and nitrogen-containing mask layer is formed by performing a process that includes thermal nitridation of a silicon-containing layer. In some implementations, a pad layer (for example, a silicon oxide layer) is formed between mask layer 240 and substrate 210 (in particular, isolation feature 230).

Patterned resist layer 245 includes an opening that exposes n-type device regions of integrated circuit device 200, such as first region 212 and second region 214, while covering p-type device regions of integrated circuit device 200, such as third region 216. Patterned resist layer 245 is also referred to as a photoresist layer, photosensitive layer, imaging layer, patterning layer, or radiation sensitive layer. Patterned resist layer 245 is formed over substrate 210 by a lithography patterning process, which includes resist coating (for example, spin-on coating), soft baking, mask aligning, exposure, post-exposure baking, developing, rinsing, drying (for example, hard baking), other suitable processes, or combinations thereof. Alternatively, the lithography exposure process is assisted, implemented, or replaced by other methods, such as maskless lithography, electron-beam writing, or ion-beam writing. In yet another alternative, the lithography patterning process implements nanoimprint technology. In some implementations, the lithography process implements an etching process, such as a dry etching, wet etching, other etching method, or combinations thereof. A rinsing process, such as a de-ionized (DI) water rinse, may be performed on the substrate 210 before forming patterned resist layer 245.

In FIG. 3C, an etching process is performed to remove portions of fin structure 220 in in n-type device regions of integrated circuit device 200, such as first region 212 and second region 214. For example, portions of source/drain regions of fins 222A and fins 222B are removed by the etching process, thereby forming source/drain recesses 250A in first region 212 and source/drain recesses 250B in second region 214. Any suitable amount of fins 222A and fins 222B is removed by the etching process to achieve a desired profile for source/drain recesses 250A and source/drain recesses 250B. In the depicted embodiment, source/drain recesses 250A and source/drain recesses 250B do not extend below a top surface of isolation feature 230, though the present disclosure contemplates embodiments where source/drain recesses 250A and source/drain recesses 250B do extend below a top surface of isolation feature 230. The etching process is a dry etching process, a wet etching process, or combinations thereof. Various etching parameters can be tuned to selectively etch fins 222A and fins 222B, such as etchant composition, etching temperature, etching solution concentration, etching time, etching pressure, source power, radio frequency (RF) bias voltage, RF bias power, etchant flow rate, other suitable etching parameters, or combinations thereof. In some implementations, fins 222A and fins 222B may be etched using etch reactants having a high etch selectivity with respect to a material of fins 222A and fins 222B. In some implementations, a wet etching process implements an etching solution that includes ammonium hydroxide ($NH_4OH$), hydrogen peroxide ($H_2O_2$), sulfuric acid ($H_2SO_4$), tetramethylammonium hydroxide (TMAH), other suitable wet etching solution, or combinations thereof. For example, the wet etching solution can utilize an $NH_4OH:H_2O_2$ solution, an $NH_4OH:H_2O_2:H_2O$ solution (known as an ammonia-peroxide mixture (APM)), or an $H_2SO_4:H_2O_2$ solution (known as a sulfuric peroxide mixture (SPM)). In some implementations, a dry etching process implements an etchant gas that includes a fluorine-containing etchant gas (for example, $CF_4$, $SF_6$, $CH_2F_2$, $CHF_3$, and/or $C_2F_6$), an oxygen-containing gas, a chlorine-containing gas (for example, $Cl_2$, $CHCl_3$, $CCl_4$, and/or $BCl_3$), a bromine-containing gas (for example, HBr and/or $CHBR_3$), an iodine-containing gas, other suitable gases and/or plasmas, or combinations thereof.

Figure 3D:
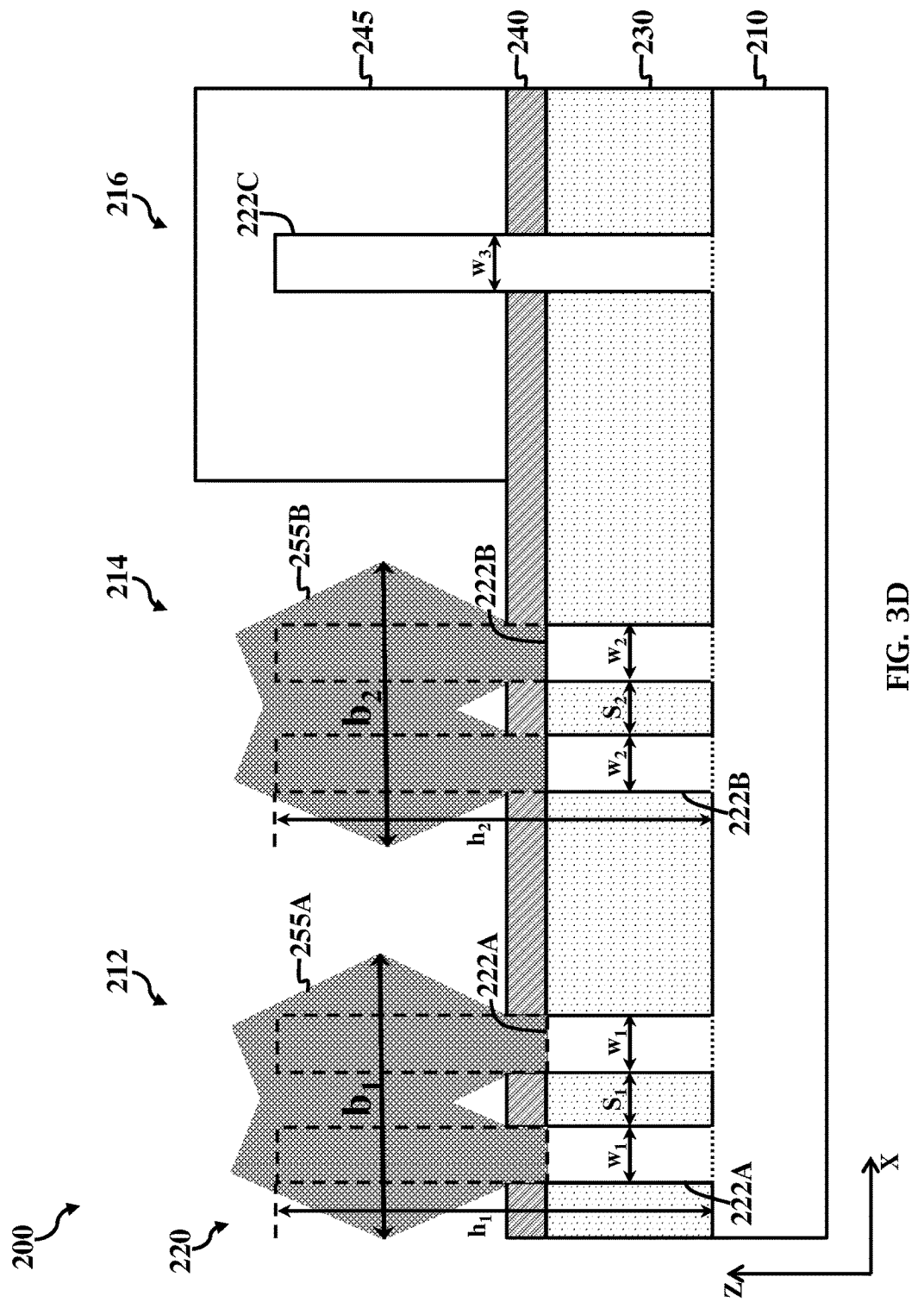

In FIG. 3D, a deposition process is performed to form epitaxial source/drain feature 255A over the source/drain regions of fins 222A and epitaxial source/drain feature 255B over the source/drain regions of fins 222B. For example, a selective epitaxial growth (SEG) process is performed to grow a semiconductor material on exposed, recessed portions of fins 222A and fins 222B. The semiconductor material fills source/drain recesses 250A and source/drain recesses 250B, extending a height (defined in the z-direction) that is greater than height $h_1$ and height $h_2$ (initial heights of fins 222A and fins 222B, respectively). In the depicted embodiment, the semiconductor material grown from adjacent source/drain recesses 250A and adjacent source/drain recesses 250B merges, such that epitaxial source/drain feature 255A spans both fins 222A in first region 212 and epitaxial source/drain feature 255B spans both fins 222B in second region 214. Epitaxial source/drain feature 255A and epitaxial source/drain feature 255B can thus be referred to as merged epitaxial source/drain features. The SEG process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The SEG process uses gaseous precursors (for example, Si-containing gases, such as $SiH_4$ and/or Ge-containing gases, such as $GeH_4$) and/or liquid precursors, which interact with a composition of fin structure 220 (here, fins 222A and fins 222B). Dopants are introduced into the SEG process, such that epitaxial source/drain feature 255A and epitaxial source/drain feature 255B are in situ doped during the SEG process. For example, epitaxial source/drain feature 255A and epitaxial source/drain feature 255B are doped during deposition by adding dopants to a source material of the SEG process.

In the depicted embodiment, where first region 212 and second region 214 are n-type device regions, epitaxial source/drain feature 255A and epitaxial source/drain feature 255B include a silicon-containing material. In such embodiments, the deposition process implements a silicon-containing precursor, such as silane ($SiH_4$), disilane ($Si_2H_6$), trisilane ($Si_3H_8$), dichlorosilane ($SiH_2Cl_2$), other silicon-containing precursor, or combinations thereof. In furtherance of such embodiments, the deposition process includes in-situ doping the silicon-containing material, where the deposition process implements an n-type dopant precursor, such as a phosphorous-containing gas (including, for example, phosphine ($PH_3$), an arsenic-containing gas (including, for example, arsine ($AsH_3$)), other n-type dopant-containing gas, or combinations thereof. Epitaxial source/drain feature 255A and epitaxial source/drain feature 255B are Si:P epitaxial source/drain features. In some implementations, epitaxial source/drain feature 255A and epitaxial source/drain feature 255B have a phosphorous dopant concentration of about $1\times10^{21}$ dopants/$cm^3$ ($cm^{-3}$) to about $5\times10^{21}$ $cm^{-3}$. In some implementations, the deposition process is performed at a temperature of about 550° C. to about 650° C. (for example, about 600° C.). In some implementations, integrated circuit device 200 is subjected to the deposition process (for example, exposed to the silicon-containing precursor and the phosphorous-containing precursor) for about 200 seconds to about 400 seconds (for example, about 300 seconds). In some implementations, the deposition process is performed until the semiconductor material between fins 222A and fins 222B extends above height $h_1$ and height $h_2$, respectively. In some implementations, the deposition process further includes in-situ doping the silicon-containing material with a carbon-containing gas (including, for example, monomethylsilane (MMS)). In such implementations, epitaxial source/drain feature 255A and epitaxial source/drain feature 255B are Si:P:C epitaxial source/drain features.

To reduce the formation of crystalline defects and/or crystalline impurities in epitaxial source/drain feature 255A and epitaxial source/drain feature 255B, such as amorphous portions (for example, amorphous silicon portions) of epitaxial source/drain feature 255A and epitaxial source/drain feature 255B, the deposition process further introduces an etchant-containing precursor, such as a chlorine-containing precursor (including, for example, chlorine ($Cl_2$) or hydrogen chloride (HCl)), into the silicon-containing precursor and the n-type dopant containing precursor, such that the deposition process also concurrently, though minimally, etches the silicon-containing material. A flow rate of the silicon-containing precursor (D) and a flow rate of the etchant-containing precursor (E) are tuned to enhance growth kinetics of the silicon-containing layer and control lateral growth of epitaxial source/drain feature 255A and epitaxial source/drain feature 255B (such as lateral dimension $b_1$ and lateral dimension $b_2$). For example, in the depicted embodiment, a ratio (D/E) of the silicon-containing precursor and the etchant-containing precursor is less than 5 (in other words, D/E<5). D/E ratios less than 5 minimize selectivity loss and crystal growth kinetics, ensuring that the silicon-containing material will not grow on other features, such as silicon nitride containing features and/or silicon oxide containing features (such as mask layer 240, isolation feature 230, and/or the gate structure (such as the dummy gate stack)). In other words, the deposition process will not exhibit silicon selectivity loss. However, if the D/E ratio is too small, minimal epitaxial growth occurs, preventing merger of the semiconductor material grown from adjacent source/drain recesses 250A and/or source/drain recesses 250B from merging to form epitaxial source/drain feature 255A and epitaxial source/drain feature 255B, respectively. In some implementations, the ratio (D/E) of the silicon-containing precursor and the etchant-containing precursor is greater than or equal to 1 (in other words, D/E≥1). In the depicted embodiment, the deposition process introduces an HCl precursor into the silicon-containing precursor and the phosphorous-containing precursor, where a ratio of an HCl flow rate to a silicon-containing precursor flow rate is less than 5, yet greater than 1 (in other words, 1≤Si D/HCl E<5). In some implementations, a flow rate of the silicon-containing precursor is about 20 standard cubic centimeters per minute (sccm) to about 500 sccm, while the flow rate of the etchant-containing precursor is about 20 sccm to about 100 sccm. In some implementations, a flow rate of the phosphorous-containing precursor is about 20 sccm to about 500 sccm.

In some implementations, a pre-cleaning process is performed before the deposition process, for example, to remove any native oxide or other contaminant from surfaces defining source/drain recesses 250A and source/drain recesses 250B, such as top surfaces of fins 222A and fins 222B. The pre-cleaning process can be configured to selectively remove native oxide or other contaminate relative to fins 222A, fins 222B, mask layer 240, isolation feature 230, substrate 210, and/or the gate structure. In some implementations, the pre-cleaning process includes a dry etching process that utilizes a fluorine-containing precursor (including, for example, fluorine (such as F and/or $F_2$), nitrogen trifluoride ($NF_3$), hydrogen fluoride (HF), other fluorine-containing etchant component, or combinations thereof) and a hydrogen-containing precursor (including, for example, hydrogen (such as H and/or $H_2$), ammonia ($NH_3$), other hydrogen-containing etchant component, or combinations thereof). In some implementations, the pre-cleaning process can selectively etch silicon oxide without (or minimally) etching silicon (in some implementations, crystalline silicon, amorphous silicon, and/or polysilicon). In some implementations, the pre-cleaning process utilizes SICONI™ technology available from Applied Materials, Inc., of Santa Clara, Calif. In some implementations, the pre-cleaning process includes a wet etching process that implements a fluorine-containing and a hydrogen-containing etching solution, such as dilute hydrogen fluoride (DHF). In some implementations, the pre-cleaning process is performed at a temperature of about 550° C. to about 650° C. (for example, about 600° C.). In some implementations, integrated circuit device 200 is subjected to the pre-cleaning process for about 10 seconds to about 30 seconds.

Figure 3E:
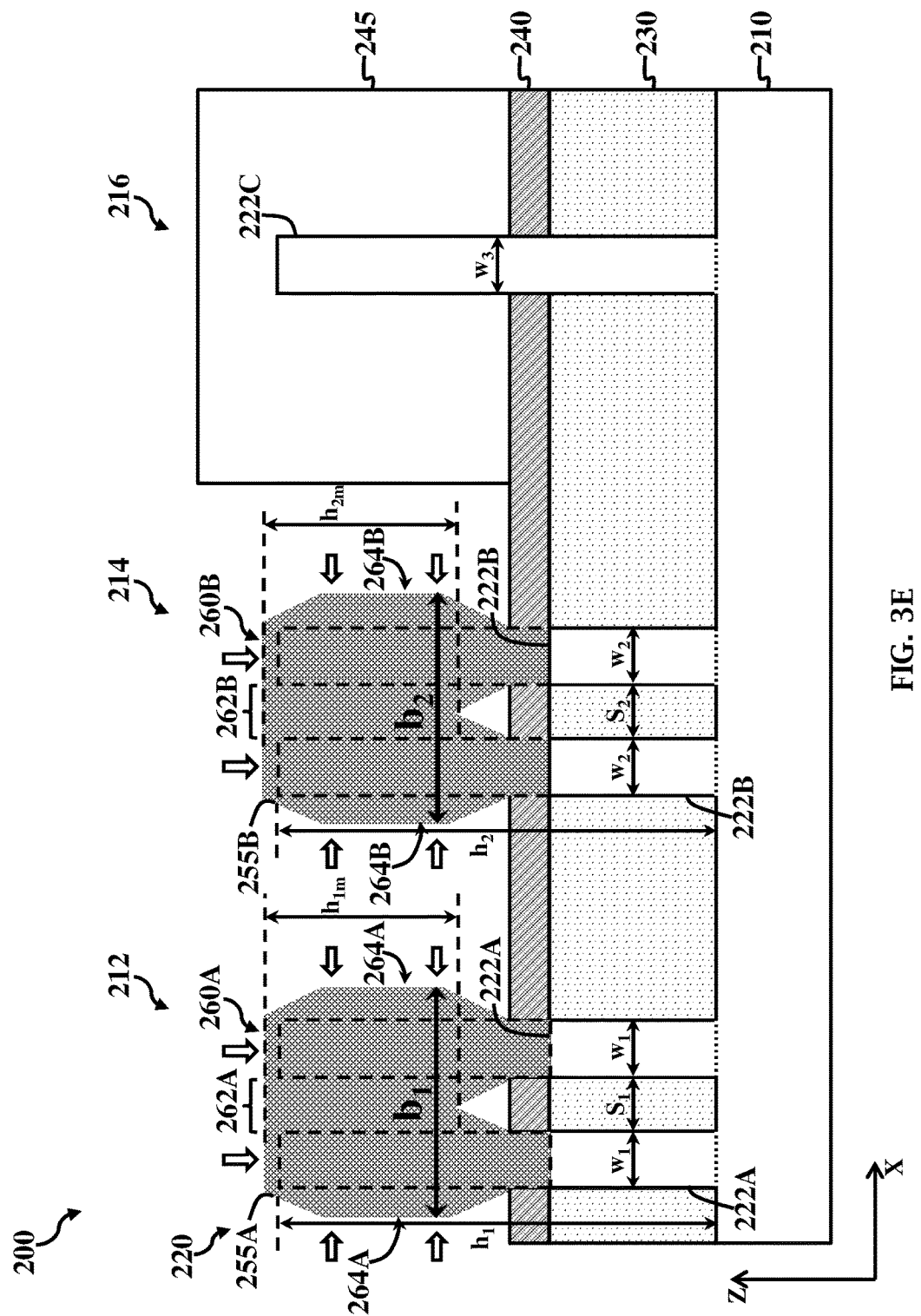

In FIG. 3E, an etching process is performed to remove (etch back) portions of epitaxial source/drain feature 255A and epitaxial source/drain feature 255B, thereby modifying a profile of epitaxial source/drain feature 255A and epitaxial source/drain feature 255B. The etching process implements a chlorine-containing precursor (also referred to as a chlorine-containing gas), such as chlorine ($Cl_2$) or hydrogen chloride (HCl). For example, in the depicted embodiment, the etching process implements an HCl precursor having a flow rate of about 100 sccm to about 1,000 sccm. In some implementations, the etching process is performed at a temperature of about 650° C. to about 750° C. (for example, about 700° C.). In some implementations, integrated circuit device 200 is subjected to the etching process for about 20 seconds to about 50 seconds (for example, about 40 seconds). In some implementations, the etching process is a selective etching process that can selectively remove crystalline defects and/or crystalline impurities from epitaxial source/drain feature 255A and epitaxial source/drain feature 255B, such as amorphous portions (for example, amorphous silicon portions) of epitaxial source/drain feature 255A and epitaxial source/drain feature 255B.

The etching process is tuned to control a profile of epitaxial source/drain feature 250A and epitaxial source/drain feature 250B. For example, the etching process planarizes top portions of epitaxial source/drain feature 255A and epitaxial source/drain feature 255B, such that epitaxial source/drain feature 255A and epitaxial source/drain feature 255B exhibit substantially flat top surfaces, such as a top surface 260A and a top surface 260B. In some implementations, top surface 260A and top surface 260B include various peaks and valleys causing surface roughness, where a peak-to-valley height variation that is ≤±5% provides substantially flat contact landing areas (for example, for coupling a contact of an interconnect structure with epitaxial source/drain feature 255A and epitaxial source/drain feature 255A). In the depicted embodiment, the etching process minimizes variations in height of a merged portion 262A of epitaxial source/drain feature 255A and a merged portion 262B of epitaxial source/drain feature 255B. Merged portion 262A and merged portion 262B are areas of epitaxial source/drain feature 255A and epitaxial source/drain feature 255B, respectively, where semiconductor material merges from adjacent source/drain recesses 250A and adjacent source/drain recesses 250B. Merged portion 262A has a corresponding height $h_{1m}$, and merged portion 262B has a corresponding 262B a corresponding height $h_{2m}$. Height $h_{1m}$ is substantially uniform across merged portion 262A, and height $h_{2m}$ is substantially uniform across merged portion 262B. In some implementations, height $h_{1m}$ is considered substantially uniform when the heights at any number of locations across a width of merged portion 262A (in other words, along the x-direction) are within ±5% of each other, and height $h_{2m}$ is considered substantially uniform when the heights at any number of locations across a width of merged portion 262B are within ±5% of each other. By minimizing height variations of merged portion 262A and merged portion 262B, epitaxial source/drain feature 255A and epitaxial source/drain feature 255A exhibit profiles that provide improved contact landing areas (for example, for coupling a contact of an interconnect structure with epitaxial source/drain feature 255A and epitaxial source/drain feature 255A) compared to epitaxial source/drain features formed using conventional CDE processes. The etching process can also planarize sidewall portions of epitaxial source/drain feature 255A and epitaxial source/drain feature 255B, such that epitaxial source/drain feature 255A and epitaxial source/drain feature 255B exhibit substantially flat sidewall surfaces, such as sidewall surfaces 264A (between which lateral dimension $b_1$ is defined) and sidewall surfaces 264B (between which lateral dimension $b_2$ is defined). In some implementations, top surfaces 260A, 260B are substantially parallel with a top surface of isolation feature 230, while sidewall surfaces 264A, 264B are substantially perpendicular to the top surface of isolation feature 230.

For fin spacing less than about 25 nm, the self-aligned source and drain formation technique described with reference to FIGS. 3D-3F (in particular, performing a deposition process and the etching process only once) facilitates precise control over lateral growth of epitaxial source/drain feature 255A and epitaxial source/drain feature 255B, thereby minimizing variations in lateral dimension $b_1$ and lateral dimension $b_2$. In some implementations, where a target for lateral dimension $b_1$ and lateral dimension $b_2$ is about 45 nm to about 55 nm, tuning the deposition process and the etching process as described herein can control the lateral dimension within about ±7 nm (for example, within 6-sigma (standard deviation)), which is much tighter than achievable by conventional CDE processes. In some implementations, tuning the deposition process and the etching process as described herein can reduce the lateral variation standard deviation (such as the 6-sigma value) by 30%. Such reduction is significant as advanced technology nodes continually scale, leaving minimal room for lateral overgrowth that can degrade device performance. Different embodiments disclosed herein offer different advantages and no particular advantage is necessarily required in all embodiments.

Figure 3F:
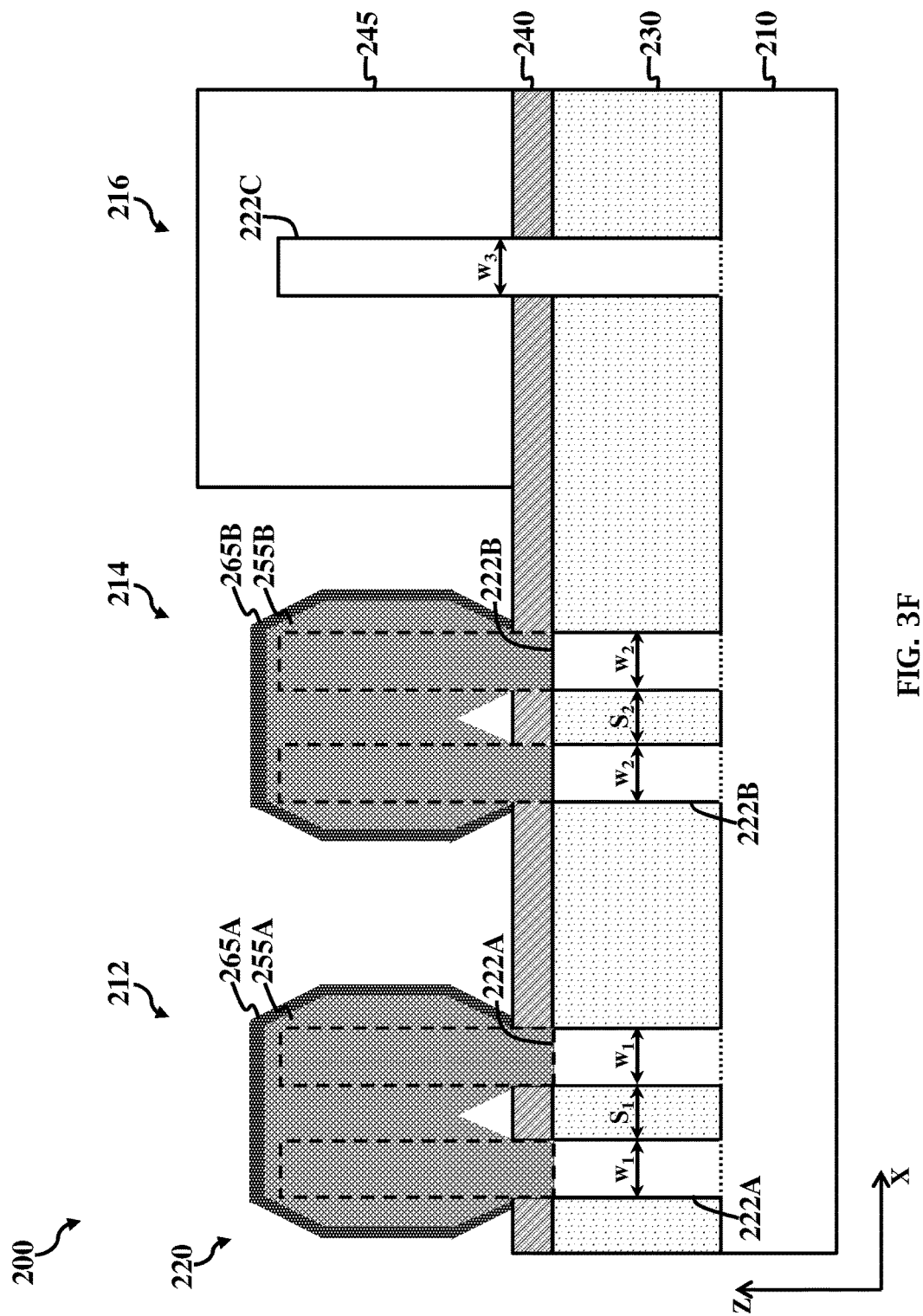

In FIG. 3F, a deposition process is performed to form an epitaxial capping layer 265A over epitaxial source/drain feature 255A and an epitaxial capping layer 265B over epitaxial source/drain feature 255B. Epitaxial capping layer 265A and epitaxial capping layer 265B can improve device performance of integrated circuit device 200. A selective epitaxial growth (SEG) process is performed to grow a semiconductor material on epitaxial source/drain feature 255A and epitaxial source/drain feature 255B. The semiconductor material conformally grows over epitaxial source/drain feature 255A and epitaxial source/drain feature 255B, such that epitaxial capping layer 265A and epitaxial capping layer 265B have substantially uniform thicknesses, such as about 1 nm to about 6 nm. The SEG process can implement CVD deposition techniques (for example, VPE, UHV-CVD, LPCVD, and/or PECVD), molecular beam epitaxy, other suitable SEG processes, or combinations thereof. The SEG process uses gaseous precursors (for example, Si-containing gases, such as $SiH_4$ and/or Ge-containing gases, such as $GeH_4$) and/or liquid precursors, which interact with a composition of epitaxial source/drain feature 255A and epitaxial source/drain feature 255B. In the depicted embodiment, the deposition process implements a silicon-containing precursor, such as $SiH_4$, $Si_2H_6$, $Si_3H_8$, $SiH_2Cl_2$, other silicon-containing precursor, or combinations thereof. In some implementations, the deposition process is performed at a temperature of about 700° C. to about 800° C. (for example, about 750° C.). In some implementations, integrated circuit device 200 is subjected to the deposition process (for example, exposed to the silicon-containing precursor) for about 100 seconds to about 200 seconds (for example, about 150 seconds). Dopants may be introduced into the SEG process, such that epitaxial capping layer 265A and epitaxial capping layer 265B are in situ doped during the SEG process. For example, epitaxial source/drain feature 255A and epitaxial source/drain feature 255B are doped during deposition by adding dopants to a source material of the SEG process. In such embodiments, the deposition process implements an n-type dopant precursor, such as a phosphorous-containing gas (including, for example, $PH_3$, an arsenic-containing gas (including, for example, $AsH_3$), other n-type dopant-containing gas, or combinations thereof. In some implementations, the deposition process further implements a carbon-containing precursor (including, for example, MMS). Thereafter, patterned resist layer 245 and mask layer 240 are removed by suitable processes.

Figure 3G:
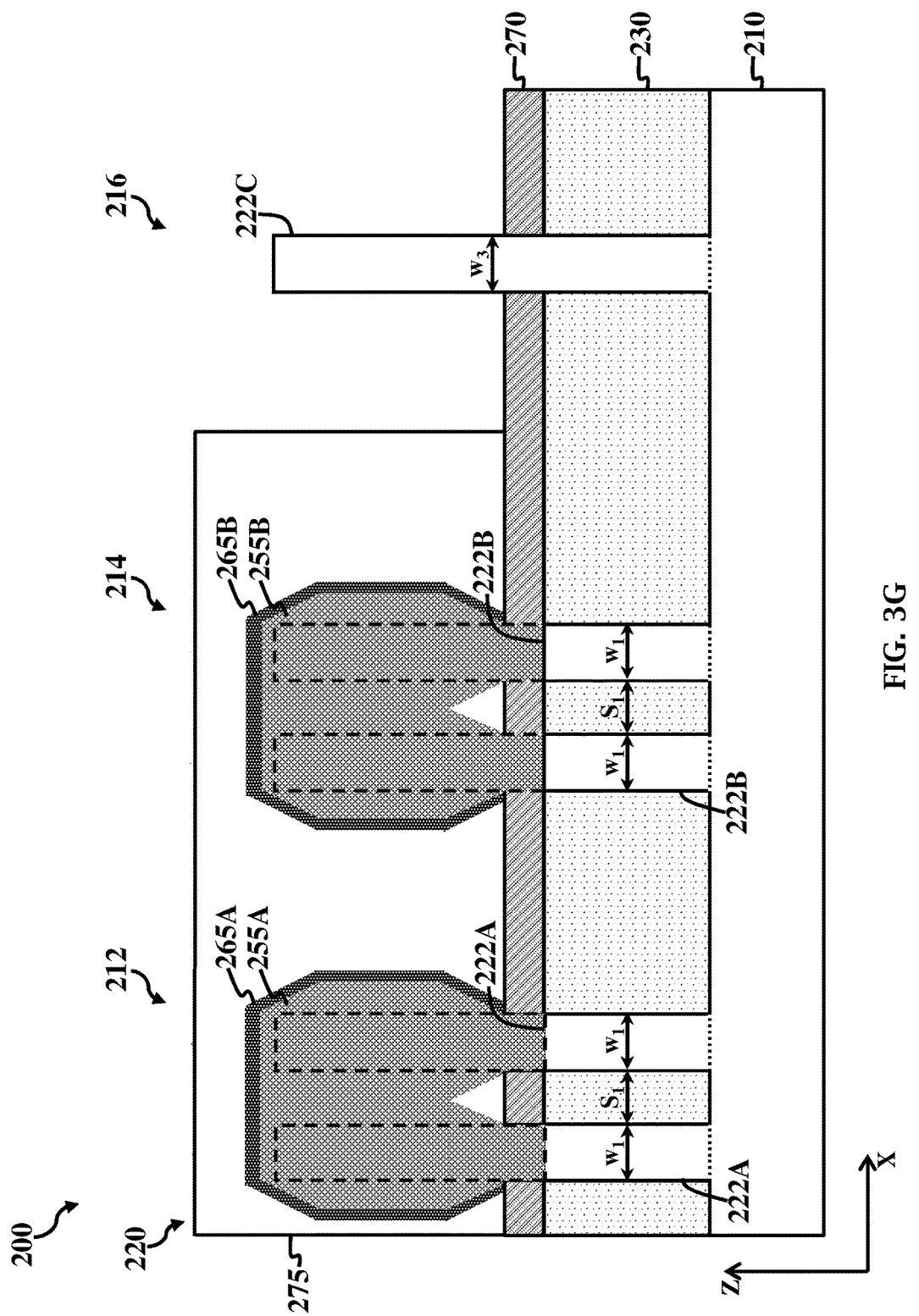
Figure 3H:
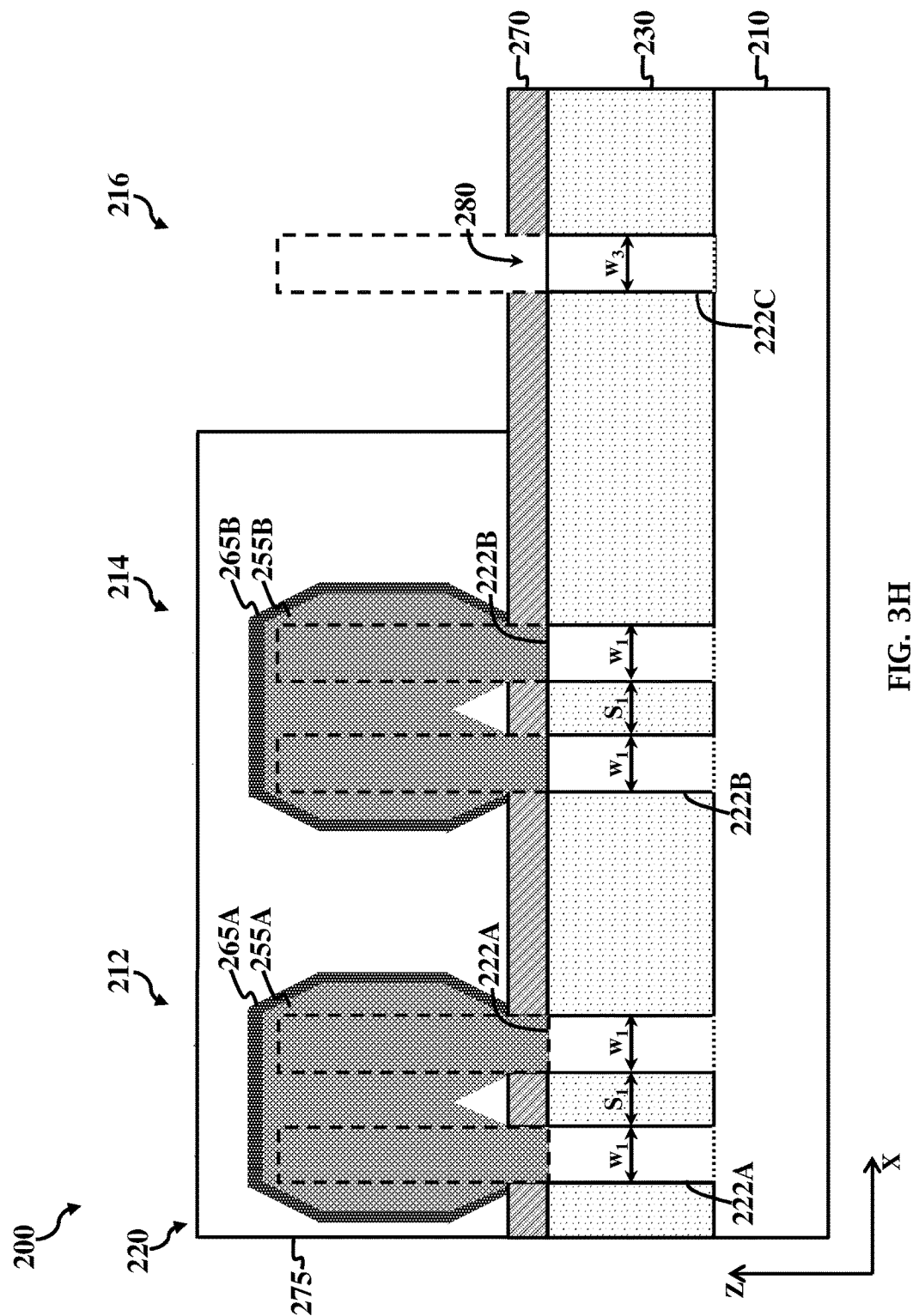

In FIGS. 3G-3J, epitaxial source features and epitaxial drain features (referred to herein as epitaxial source/drain features) are formed in source/drain regions of p-type regions, such as third region 216 of integrated circuit device 200. Turning to FIG. 3G and FIG. 3H, processing continues with recessing source/drain regions of fins in p-type device regions of integrated circuit device 200, such as third region 216. In FIG. 3G, a mask layer 270 is formed over substrate 210 (in the depicted embodiment, over isolation feature 230), and a patterned resist layer 275 is formed over mask layer 270. Mask layer 270 includes a material having a different etching rate than a material of fin structure 220 (in particular, fin 222C). For example, mask layer 270 includes silicon nitride, silicon oxide, silicon oxynitride, silicon carbide, silicon carbon nitride, amorphous silicon, polysilicon, other suitable material, or combinations thereof. In the depicted embodiment, mask layer 270 includes silicon nitride. In some implementations, mask layer 270 includes a material that has a low etch rate relative to a material of fin structure 220, such that fin 222C can be selectively etched relative to mask layer 270. Mask layer 240 is formed by any suitable process, such as a CVD process, to any suitable thickness. In some implementations, a silicon-containing and nitrogen-containing mask layer is formed using LPCVD. In some implementations, a silicon-containing and nitrogen-containing mask layer is formed by performing a process that includes thermal nitridation of a silicon-containing layer. In some implementations, a pad layer (for example, a silicon oxide layer) is formed between mask layer 270 and substrate 210 (in particular, isolation feature 230).

Patterned resist layer 275 includes an opening that exposes p-type device regions of integrated circuit device 200, such as third region 216, while covering n-type device regions of integrated circuit device 200, such as first region 212 and second region 214. Patterned resist layer 275 is also referred to as a photoresist layer, photosensitive layer, imaging layer, patterning layer, or radiation sensitive layer. Patterned resist layer 275 is formed over substrate 210 by a lithography patterning process, which includes resist coating (for example, spin-on coating), soft baking, mask aligning, exposure, post-exposure baking, developing, rinsing, drying (for example, hard baking), other suitable processes, or combinations thereof. Alternatively, the lithography exposure process is assisted, implemented, or replaced by other methods, such as maskless lithography, electron-beam writing, or ion-beam writing. In yet another alternative, the lithography patterning process implements nanoimprint technology. In some implementations, the lithography process implements an etching process, such as a dry etching, wet etching, other etching method, or combinations thereof.

A rinsing process, such as a de-ionized (DI) water rinse, may be performed on the substrate 210 before forming patterned resist layer 275.

In FIG. 3H, an etching process is performed to remove portions of fin structure 220 in in p-type device regions of integrated circuit device 200, such as third region 216. For example, portions of source/drain regions of fin 222C are removed by the etching process, thereby forming source/drain recess 280. Any suitable amount of fin 222C is removed by the etching process to achieve a desired profile for source/drain recess 280. In the depicted embodiment, source/drain recess 280 does not extend below a top surface of isolation feature 230, though the present disclosure contemplates embodiments where source/drain recess 280 does extend below a top surface of isolation feature 230. The etching process is a dry etching process, a wet etching process, or combinations thereof. Various etching parameters can be tuned to selectively etch fin 222C, such as etchant composition, etching temperature, etching solution concentration, etching time, etching pressure, source power, RF bias voltage, RF bias power, etchant flow rate, other suitable etching parameters, or combinations thereof. In some implementations, fin 222C may be etched using etch reactants having a high etch selectivity with respect to a material of fin 222C. In some implementations, a wet etching process implements an etching solution that includes $NH_4OH$, $H_2O_2$, $H_2SO_4$, TMAH, other suitable wet etching solution, or combinations thereof. For example, the wet etching solution can utilize an $NH_4OH:H_2O_2$ solution, an APM solution, or an SPM solution. In some implementations, a dry etching process implements an etchant gas that includes a fluorine-containing etchant gas (for example, $CF_4$, $SF_6$, $CH_2F_2$, $CHF_3$, and/or $C_2F_6$), an oxygen-containing gas, a chlorine-containing gas (for example, $Cl_2$, $CHCl_3$, $CCl_4$, and/or $BCl_3$), a bromine-containing gas (for example, HBr and/or $CHBR_3$), an iodine-containing gas, other suitable gases and/or plasmas, or combinations thereof.

Figure 3I:
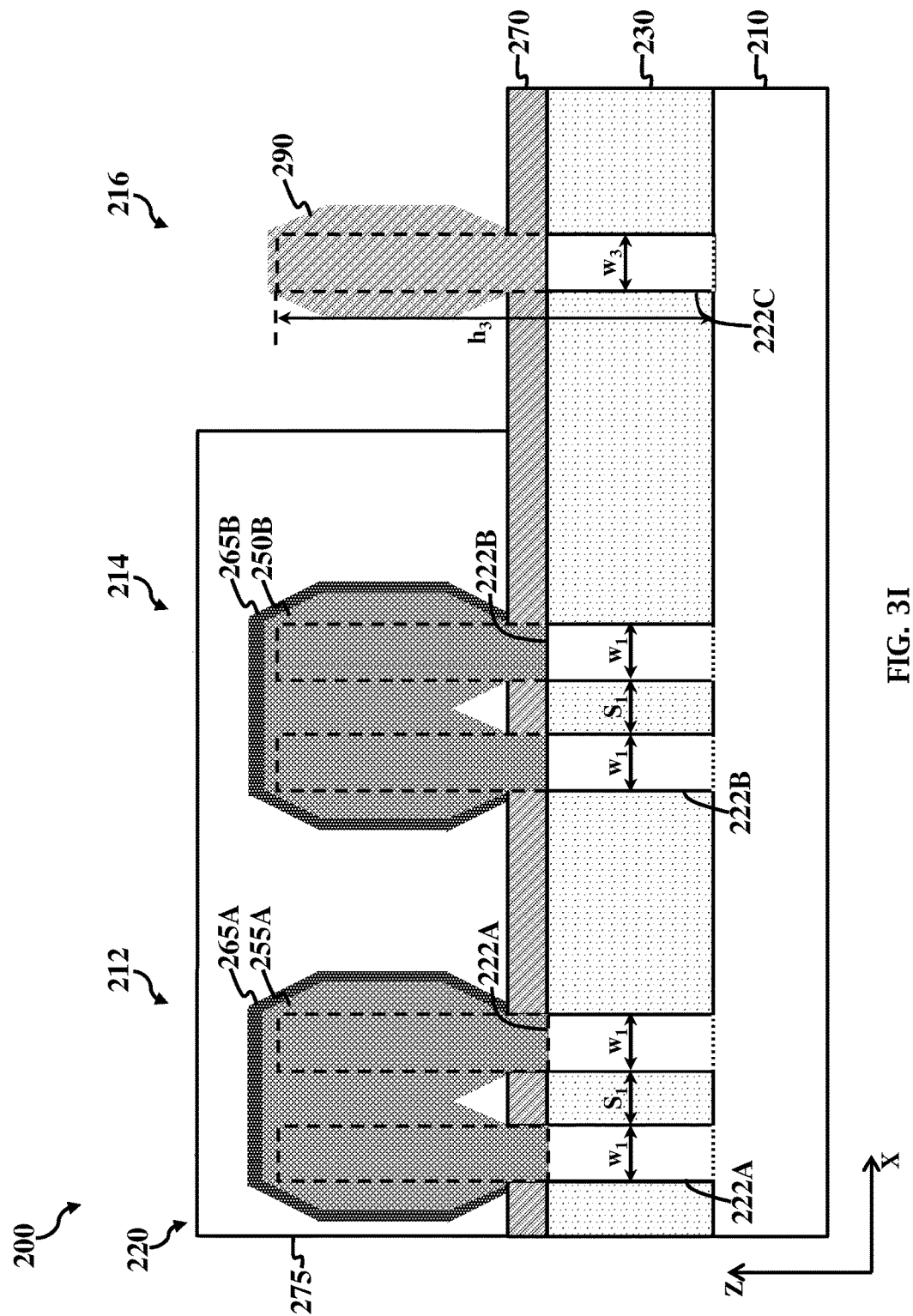
Figure 3J:
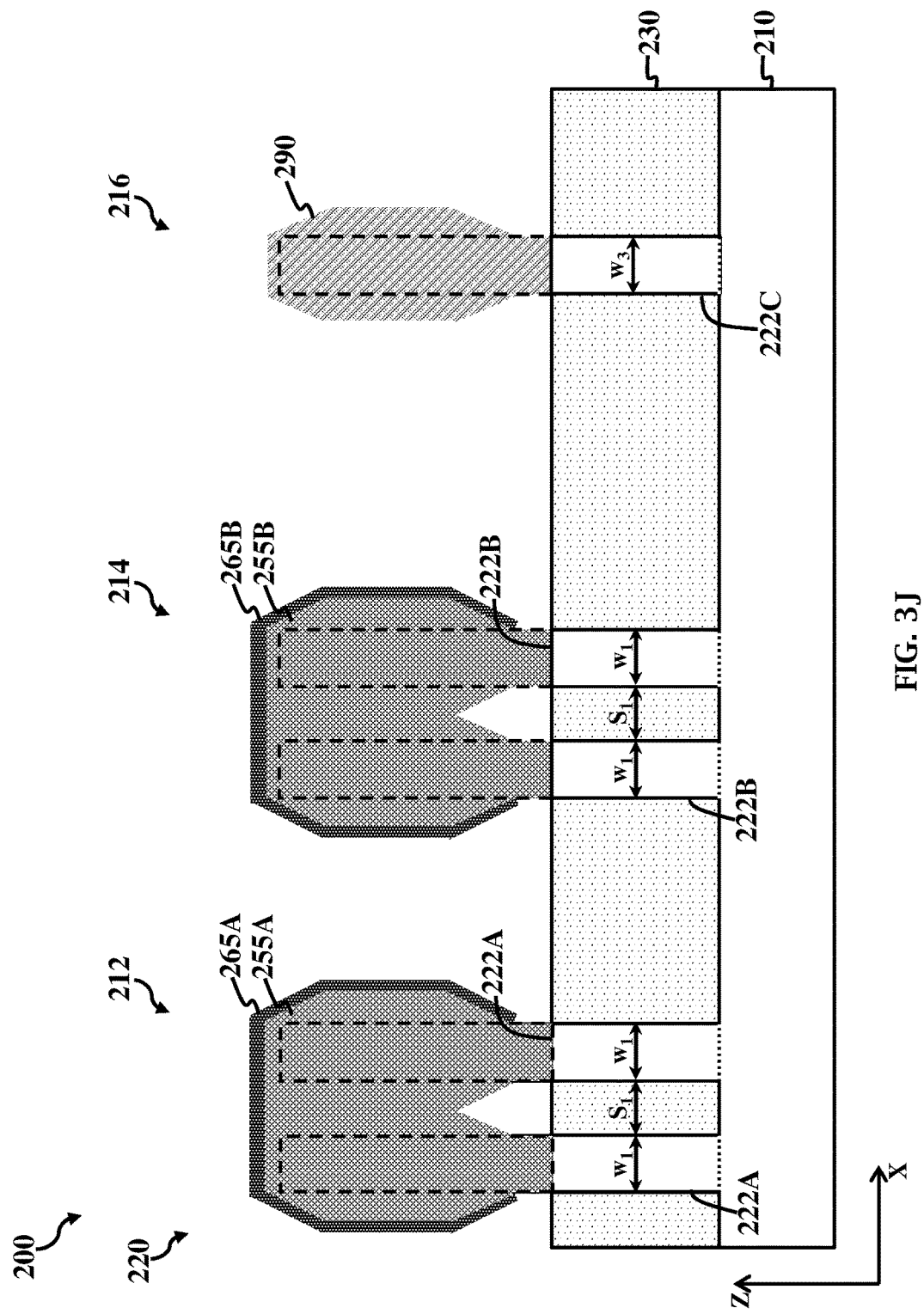

In FIG. 3I, a deposition process is performed to form epitaxial source/drain feature 290 over the source/drain regions of fin 222C. For example, a SEG process is performed to grow a semiconductor material on exposed, recessed portions of fin 222C. The semiconductor material fills source/drain recess 280, extending a height (defined in the z-direction) that is greater than height $h_3$ (initial height of fin 222C). The SEG process can implement CVD deposition techniques (for example, VPE, UHV-CVD, LPCVD, and/or PECVD), molecular beam epitaxy, other suitable SEG processes, or combinations thereof. The SEG process uses gaseous precursors (for example, Si-containing gases, such as $SiH_4$ and/or Ge-containing gases, such as $GeH_4$) and/or liquid precursors, which interact with a composition of fin structure 220 (here, fins 222A and fins 222B). In the depicted embodiment, where third region 216 is a p-type device regions, epitaxial source/drain feature 290 includes a silicon germanium-containing material. In such embodiments, the deposition process implements a silicon-containing precursor (including, for example, $SiH_4$, $Si_2H_6$, $Si_3H_8$, $SiH_2Cl_2$, other silicon-containing precursor, or combinations thereof) and a germanium-containing precursor (including, for example, germane ($GeH_4$), germanium tetrachloride ($GeCl_4$), other germanium-containing precursor, or combinations thereof). Dopants may be introduced into the SEG process, such that epitaxial source/drain feature 290 is in situ doped during the SEG process. For example, epitaxial source/drain feature 280 is doped during deposition by adding dopants to a source material of the SEG process. In such embodiments, the deposition process includes in-situ doping the silicon germanium-containing material, where the deposition process implements a p-type dopant precursor, such as a boron-containing precursor (including, for example, boron (B) and/or boron fluoride ($BF_2$)), other p-type dopant-containing gas, or combinations thereof. In such embodiments, epitaxial source/drain feature 280 is a Si:Ge:B epitaxial source/drain feature. In some implementations, epitaxial source/drain feature 280 has a boron dopant concentration of about $1 \times 10^{21}$ dopants/$cm^3$ ($cm^{-3}$) to about $5 \times 10^{21}$ $cm^{-3}$. Thereafter, patterned resist layer 275 and mask layer 270 are removed by suitable processes, as depicted in FIG. 3I.

Integrated circuit device 200 can undergo subsequent processing to complete fabrication. For example, a gate replacement process is performed to replace a dummy gate stack of the gate structure(s) with a metal gate stack. In some implementations, an inter-level dielectric (ILD) layer is formed over substrate 210, for example, by a deposition process (such as CVD, PVD, ALD, HDPCVD, MOCVD, RPCVD, PECVD, LPCVD, ALCVD, APCVD, plating, other suitable methods, or combinations thereof). The ILD layer includes a dielectric material, such as silicon oxide, silicon nitride, silicon oxynitride, TEOS formed oxide, phosphosilicate glass (PSG), borophosphosilicate glass (BPSG), low-k dielectric material, other suitable dielectric material, or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, or combinations thereof. In some implementations, the ILD layer can include a multilayer structure having multiple dielectric materials.

Subsequent to the deposition of the ILD layer, a CMP process may be performed, such that a top portion of the gate structure(s) is reached (exposed), such as a top portion of the dummy gate electrode layer(s). A portion of the gate structure(s) (such as a dummy gate electrode layer, and in some implementations, a dummy gate dielectric layer) is then removed, thereby forming a trench (opening), which exposes fin structure 220, an interfacial layer, and/or gate dielectric layer. In some implementations, an etching process selectively removes the dummy gate electrode layer (and, in some implementations, a dummy gate dielectric layer). The etching process is a dry etching process, a wet etching process, or combinations thereof. A selective etching process can be tuned, such that the dummy gate electrode layer has an adequate etch rate relative to fin structure 220, the interfacial layer, the gate dielectric layer, the spacers, and/or the ILD layer. A metal gate stack of the gate structure (s) is then formed in the opening (trench). The metal gate stack includes a gate dielectric layer and a gate electrode layer, as described herein (for example, with reference to FIG. 1). In some implementations, silicide features are formed in gate regions and/or source/drain regions. For example, silicide features can be formed on epitaxial capping layer 265A, epitaxial capping layer 265B, epitaxial source/drain feature 280, and/or the gate structure(s). The silicide features are formed by a silicidation process, such as a self-aligned silicide (salicide) process.

Various contacts can be formed to facilitate operation of integrated circuit device 200. For example, an ILD layer can be formed over substrate 210 (in some implementations, a second ILD layer formed over a first ILD layer (formed during the gate replacement process)). Contacts can then be formed in the ILD layer(s). For example, a contact is electrically coupled with the gate structure(s) (particularly, the gate electrode layer), and contacts are electrically coupled to the source/drain regions of fin structure 220 (particularly, via epitaxial source/drain features 255A (and/ or epitaxial capping layer 265A) in first region 212, epitaxial source/drain features 250B (and/or epitaxial capping layer 265B) in second region 214, and/or epitaxial features 290 in third region 216). Contacts include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some implementations, the ILD layer(s) and contacts (for example, extending through the ILD layer(s)) are a portion of a multilayer interconnect (MLI) feature disposed over substrate 210. The MLI feature electrically couples various components of integrated circuit device 200, such that the various components are operable to function as specified by design requirements of integrated circuit device 200. The MLI feature can include a combination of metal layers and ILD layers configured to form vertical interconnect features, such as contacts and/or vias, and/or horizontal interconnect features, such as lines. The various conductive features include materials similar to the contacts. In some implementations, a damascene process and/or dual damascene process is used to form a copper-based multilayer interconnection structure.

The present disclosure provides for various source and drain formation techniques for fin-like field effect transistors (FinFETs). An exemplary method includes forming a first fin and a second fin over a substrate. The first fin and the second fin have a fin spacing less than about 25 nm. The first fin and the second fin each include a channel region disposed between a source region and a drain region. The method further includes forming a gate structure over the channel regions of the first fin and the second fin. The method further includes performing a deposition process and an etching process only once to form a merged epitaxial source feature that spans the source regions of the first fin and the second fin and a merged epitaxial drain feature that spans the drain regions of the first fin and the second fin. In some implementations, the deposition process implements a silicon-containing precursor and a chlorine-containing precursor, wherein a ratio of a flow rate of the silicon-containing precursor to a flow rate of the chlorine-containing precursor is less than 5. In some implementations, the etching process implements the chlorine-containing precursor. In some implementations, the chlorine-containing precursor includes hydrogen chloride. In some implementations, the deposition process further implements a phosphorous-containing precursor.

In some implementations, the method further includes recessing the first fin and the second fin before forming the merged epitaxial source feature and the merged epitaxial drain feature. In some implementations, the method further includes forming an epitaxial capping layer over the merged epitaxial source feature and the merged epitaxial drain feature. In some implementations, the method further includes performing a gate replacement process after forming the merged epitaxial source feature and the merged epitaxial drain feature. In some implementations, the merged epitaxial source feature and the merged epitaxial drain feature each have a merged portion having a substantially uniform height. In some implementations, the merged epitaxial source feature and the merged epitaxial drain feature each have a lateral dimension of about 45 nm to about 55 nm, wherein the etching process and the deposition process are tuned to control the lateral dimension within about ±7 nm.

Another exemplary method includes forming a fin structure that includes at least two fins having a fin spacing less than about 25 nm, and forming an epitaxial feature over a source/drain region of the fin structure. Forming the epitaxial feature includes performing a single deposition process to form an epitaxial layer over the fin structure and performing a single etching process to the epitaxial layer. The single deposition process implements a ratio of a flow rate of a source-containing precursor to a flow rate of an etchant-containing precursor that is less than 5. In some implementations, the method further includes recessing the at least two fins before forming the epitaxial feature.

In some implementations, the single deposition process includes growing a semiconductor material from the at least two fins, wherein the semiconductor material grown from the at least two fins merges to form the epitaxial feature. In some implementations, the source-containing precursor includes silicon, the etchant-containing precursor includes hydrogen chloride, and the single etching process implements the etchant-containing containing precursor. In some implementations, the single deposition process further implements a dopant-containing precursor, for example, including phosphorous.

Another exemplary method for forming epitaxial source/drain features for a FinFET includes epitaxially growing a semiconductor material on a plurality of fins using a silicon-containing precursor and a chlorine-containing precursor. The semiconductor material merges to form an epitaxial feature spanning the plurality of fins. The plurality of fins has a fin spacing that is less than about 25 nm. A ratio of a flow rate of the silicon-containing precursor to a flow rate of the chlorine-containing precursor is less than about 5. The method further includes etching back the semiconductor material using the chlorine-containing precursor, thereby modifying a profile of the epitaxial feature. In some implementations, the epitaxially growing and the etching back are performed only once.

In some implementations, the chlorine-containing precursor includes hydrogen chloride. In some implementations, the epitaxially growing also uses a phosphorous-containing precursor. In some implementations, the method further includes recessing the plurality of fins before the epitaxially growing, such that the semiconductor material is grown from a plurality of source/drain recesses. In some implementations, forming the epitaxial source/drain features further includes performing a lithography process to expose the plurality of fins corresponding with the n-type FinFET. In some implementations, the method further includes forming epitaxial source/drain features for a p-type FinFET.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first fin and a second fin over a substrate, wherein the first fin and the second fin have a fin spacing less than about 25 nm, and further wherein the first fin and the second fin each includes a channel region disposed between a source region and a drain region;
   forming a gate structure over the channel regions of the first fin and the second fin; and
   performing only one cycle of a cyclic deposition etch process to form a merged epitaxial source feature that spans the source regions of the first fin and the second fin and a merged epitaxial drain feature that spans the drain regions of the first fin and the second fin, wherein the one cycle of the cyclic deposition etch process includes:
      a deposition process that forms a semiconductor material over the first fin and the second fin, wherein the deposition process is performed until the semiconductor material in the fin spacing between the first fin and the second fin extends above an initial height of the first fin and the second fin, and
      an etching process to planarize the semiconductor material to achieve a substantially flat top surface and substantially flat sidewall surfaces for each of the merged epitaxial source feature and the merged epitaxial drain feature, wherein the etching process is separate from the deposition process.

2. The method of claim 1, wherein:
   the deposition process implements a silicon-containing precursor and a chlorine-containing precursor to form the semiconductor material, wherein a flow rate of the silicon-containing precursor is about 20 standard cubic centimeters per minute (sccm) to about 500 sccm and a flow rate of the chlorine-containing precursor is about 20 sccm to about 100 sccm; and
   the etching process implements the chlorine-containing precursor, wherein a flow rate of the chlorine-containing precursor is about 100 sccm to about 1,000 sccm.

3. The method of claim 2, wherein the chlorine-containing precursor includes hydrogen chloride.

4. The method of claim 2, wherein the deposition process further implements a phosphorous-containing precursor and a flow rate of the phosphorous-containing precursor is about 20 sccm to about 500 sccm.

5. The method of claim 1, further comprising recessing the first fin and the second fin from the initial height before forming the merged epitaxial source feature and the merged epitaxial drain feature.

6. The method of claim 1, further comprising forming an epitaxial capping layer over the merged epitaxial source feature and the merged epitaxial drain feature.

7. The method of claim 1, further comprising performing a gate replacement process after forming the merged epitaxial source feature and the merged epitaxial drain feature.

8. The method of claim 1, wherein the etching process is configured to selectively remove crystalline defects from the semiconductor material and minimize height variations in the merged epitaxial source feature and the merged epitaxial drain feature, such that the merged epitaxial source feature and the merged epitaxial drain feature each have a merged portion having a substantially uniform height.

9. The method of claim 1, wherein the merged epitaxial source feature and the merged epitaxial drain feature each have a lateral dimension of about 45 nm to about 55 nm, wherein the cyclic deposition etch process is tuned to control the lateral dimension within about ±7 nm.

10. A method comprising:
forming a fin structure of a first device that includes at least two fins having a fin spacing less than about 25 nm; and
forming an epitaxial feature of the first device over a source/drain region of the fin structure, wherein the epitaxial feature has a merged portion having a height that does not vary greater than ±5% along a width of the merged portion, wherein the forming the epitaxial feature includes performing:
only one selective epitaxial growth process to form an epitaxial layer over the fin structure, wherein the selective epitaxial growth process implements a ratio of a flow rate of a source-containing precursor to a flow rate of an etchant-containing precursor that is about 1 to about 5, wherein the selective epitaxial growth process is configured to constrain a lateral dimension of the epitaxial layer, such that the epitaxial layer does not extend into an epitaxial feature region corresponding with a second device, an etch process window corresponding with a third device, or both, and
only one etching process to modify a profile of the epitaxial layer, wherein the only one etching process is separate from and performed after the selective epitaxial growth process, and further wherein the only one etching process includes planarizing a semiconductor material to achieve a substantially flat top surface between the at least two fins and substantially flat sidewall surfaces between which a lateral dimension of the epitaxial feature is defined.

11. The method of claim 10, wherein:
the selective epitaxial growth process includes growing the semiconductor material from the at least two fins, wherein the semiconductor material grown from the at least two fins merges to form the epitaxial feature, wherein the semiconductor material disposed between the at least two fins is higher than a top surface of the fin structure, and further wherein the semiconductor material disposed between the at least two fins is lower than the semiconductor material disposed over the at least two fins.

12. The method of claim 11, further comprising recessing the at least two fins before forming the epitaxial feature.

13. The method of claim 10, wherein the source-containing precursor includes silicon, the etchant-containing precursor includes hydrogen chloride, and the etching process implements the etchant-containing precursor.

14. The method of claim 10, wherein the first device, the second device, and the third device are a portion of a static random access (SRAM) memory.

15. A method comprising:
simultaneously forming first epitaxial source/drain features for a first n-type fin-like field effect transistor (FinFET) and second epitaxial source/drain features for a second n-type FinFET disposed adjacent to the first n-type FinFET, wherein the simultaneously forming the first epitaxial source/drain features and the second epitaxial source/drain features includes:
epitaxially growing a semiconductor material on a first plurality of fins of the first n-type FinFET and a second plurality of fins of the second n-type FinFET using a silicon-containing precursor, a phosphorous-containing precursor, and a chlorine-containing precursor, wherein:
the first plurality of fins and the second plurality of fins each have a fin spacing that is less than about 25 nm,
a ratio of a flow rate of the silicon-containing precursor to a flow rate of the chlorine-containing precursor is less than 5, and
the semiconductor material merges to form a first merged epitaxial feature spanning the first plurality of fins and a second merged epitaxial feature spanning the second plurality of fins, wherein the ratio of the flow rate of the silicon-containing precursor to the flow rate of the chlorine-containing precursor controls lateral growth of the first merged epitaxial feature and the second merged epitaxial feature, such that the first merged epitaxial feature does not merge with the second merged epitaxial feature; and
etching back the semiconductor material using the chlorine-containing precursor, thereby modifying a profile of the first merged epitaxial feature and the second merged epitaxial feature.

16. The method of claim 15, wherein the chlorine-containing precursor includes hydrogen chloride.

17. The method of claim 15, further comprising performing a single cycle of the epitaxially growing and the etching back.

18. The method of claim 15, further comprising recessing the first plurality of fins and the second plurality of fins before the epitaxially growing, such that the semiconductor material is grown from a first plurality of source/drain recesses and a second plurality of source/drain recesses.

19. The method of claim 15, wherein the forming the first epitaxial source/drain features and the second epitaxial source/drain features further includes performing a lithography process to expose the first plurality of fins corresponding with the first n-type FinFET and the second plurality of fins corresponding with the second n-type FinFET.

20. The method of claim 15, further comprising forming epitaxial source/drain features for a p-type FinFET, wherein the second n-type FinFET is disposed between the first n-type FinFET and the p-type FinFET.

* * * * *